United States Patent
Kawabata et al.

[11] Patent Number: 6,097,134
[45] Date of Patent: Aug. 1, 2000

[54] PIEZOELECTRIC RESONATOR AND ELECTRONIC COMPONENT INCLUDING SAME

[75] Inventors: Shoichi Kawabata; Toshihiko Unami, both of Omihachiman; Takashi Mizuguchi, Shiga-ken; Jiro Inoue, Omihachiman; Mamoru Ogawa; Toshiyuki Baba, both of Moriyama; Toshio Nishimura, Shiga-ken, all of Japan

[73] Assignee: Murata Manufacturing Co., Ltd., Japan

[21] Appl. No.: 09/064,327

[22] Filed: Apr. 22, 1998

[30] Foreign Application Priority Data

| Apr. 25, 1997 | [JP] | Japan | 9-123278 |
| Apr. 25, 1997 | [JP] | Japan | 9-123279 |
| Oct. 1, 1997 | [JP] | Japan | 9-286176 |

[51] Int. Cl.[7] ................................ H01L 41/08
[52] U.S. Cl. .................. 310/366; 310/348; 310/359
[58] Field of Search .................. 310/366, 359, 310/348

[56] References Cited

U.S. PATENT DOCUMENTS

| 3,378,704 | 4/1968 | Miller et al. . | |
| 4,633,120 | 12/1986 | Sato et al. ........................ | 310/328 |
| 5,153,477 | 10/1992 | Jomura et al. .................... | 310/328 |
| 5,175,465 | 12/1992 | Um et al. .......................... | 310/328 |
| 5,825,262 | 10/1998 | Inoue et al. ...................... | 310/366 |
| 5,892,416 | 4/1999 | Unami et al. .................... | 310/366 |
| 5,900,790 | 5/1999 | Unami et al. .................... | 310/366 |
| 5,912,600 | 6/1999 | Unami ............................... | 310/366 |
| 5,912,601 | 6/1999 | Unami et al. .................... | 310/366 |

FOREIGN PATENT DOCUMENTS 0 823 781 A2   2/1998   European Pat. Off. .

*Primary Examiner*—Nestor Ramirez
*Assistant Examiner*—Peter Medley
*Attorney, Agent, or Firm*—Graham & James LLP

[57] ABSTRACT

A piezoelectric resonator having a small spurious resonance and a large difference ΔF between the resonant frequency and the antiresonant frequency has a compact size and an external electrode has a structure which prevents damage or breaking of the external electrode. The piezoelectric resonator has a substantially rectangular-parallelepiped base member which includes a plurality of laminated piezoelectric layers. A middle portion of the piezoelectric layers is polarized in opposite directions relative to each other. On main surfaces of the middle part of the piezoelectric layers, first and second groups of inner electrodes and are exposed alternately at both side surfaces of the base member. On both side surfaces of the base member, first and second external electrodes are arranged so as to alternately connect to the first and second groups of inner electrodes.

20 Claims, 32 Drawing Sheets

16  14

18  14

14  16

14  18

14  16

18  14

14  16

18  14

14  16

18  14

14  16

18  14

14   16

18   14

14   16

18   14

14  16

18  14

14  16

18  14

14   16

18   14

14   16

18   14

PIEZOELECTRIC RESONATOR AND ELECTRONIC COMPONENT INCLUDING SAME

BACKGROUND OF THE INVENTION

1. Technical Field of the Invention

The present invention relates to piezoelectric resonators and electronic components including such piezoelectric resonators, and more particularly, to a piezoelectric resonator which maximizes the use of the mechanical resonance of a piezoelectric member, and electronic components including such a piezoelectric resonator, such as an oscillator, a discriminator, and a filter.

2. Description of the Related Art

FIG. 37 is a perspective view of a conventional piezoelectric resonator. A piezoelectric resonator 1 includes a piezoelectric substrate 2 having, for example, a rectangular plate shape as viewed from above. The piezoelectric substrate 2 is polarized in the thickness direction thereof. Electrodes 3 are provided on both major surfaces of the piezoelectric substrate 2. When a signal is input between the electrodes 3, an electrical field is applied to the piezoelectric substrate 2 in the thickness direction and the piezoelectric substrate 2 vibrates in the longitudinal direction. In FIG. 38, there is shown a piezoelectric resonator 1 in which electrodes 3 are disposed on both major surfaces of a piezoelectric substrate 2 having a square plate shape as viewed from above. The piezoelectric substrate 2 of the piezoelectric resonator 1 is polarized in the thickness direction. When a signal is input between the electrodes 3 of the piezoelectric resonator 1, an electrical field is applied to the piezoelectric substrate 2 in the thickness direction and the piezoelectric substrate 2 vibrates in a square-type vibration mode.

These piezoelectric resonators are of an unstiffened type, in which the vibration direction differs from the direction of polarization and the direction of application of electrical field. The electromechanical coupling coefficient of such an unstiffened piezoelectric resonator is lower than that of a stiffened piezoelectric resonator, in which the vibration direction, the direction of polarization, and the direction in which an electrical field is applied are the same. An unstiffened piezoelectric resonator has a relatively small frequency difference ΔF between the resonant frequency and the antiresonant frequency. This causes a problem in that a frequency bandwidth in use is narrow when an unstiffened frequency resonator is used as an oscillator or a filter. Therefore, the degree of freedom in characteristics design is low in such a piezoelectric resonator and electronic components including such a piezoelectric resonator.

The piezoelectric resonator shown in FIG. 37 generates a first-order resonance in the longitudinal mode. It also generates, due to its structure, large spurious resonances in odd-number-order harmonic modes, such as the third-order and fifth-order modes, and spurious resonances in a width mode. To suppress these spurious resonances, some corrective measures to be applied to the piezoelectric resonator have been considered, such as polishing the resonator surfaces, increasing mass, and changing the shape of the electrodes. These corrective measures increase manufacturing cost, time and difficulty.

Because the piezoelectric substrate of the piezoelectric resonator shown in FIG. 37 has a rectangular plate shape, the substrate cannot be made thinner because strength requirements necessitate that the substrate have a minimum thickness. Therefore, the distance between the electrodes cannot be reduced and a capacitance between terminals cannot be increased. These disadvantages and limitations on the design and manufacture of the resonator makes it extremely difficult to achieve impedance matching with an external circuit.

To form a ladder filter by connecting a plurality of piezoelectric resonators in series and in parallel alternately, the capacitance ratio of the series resonator to the parallel resonator must be large in order to increase attenuation in zones other than the pass band. Because a piezoelectric resonator has the shape and configuration restrictions described above, however, a large attenuation may not be obtained.

The piezoelectric resonator shown in FIG. 38 generates first-order resonance in the square-type mode. Because of its structure, large spurious resonances such as those in the thickness mode and in the third-harmonic mode in the plane direction are very likely to be generated. Since the piezoelectric resonator must have a large size as compared with a piezoelectric resonator using the longitudinal vibration in order to obtain the same resonant frequency, it is difficult to reduce the size of piezoelectric resonator of the type shown in FIG. 38.

When a ladder filter is formed by a plurality of piezoelectric resonators, in order to increase the capacitance ratio between the series resonator and the parallel resonator, the resonators connected in series have increased thicknesses and electrodes are formed only on part of a piezoelectric substrate to make the capacitance small. Since the electrodes are only partially formed on the surfaces of the piezoelectric substrate, the difference ΔF between the resonant frequency and the antiresonant frequency and the capacitance is reduced. The resonators connected in parallel are therefore required to have small ΔF. As a result, the piezoelectricity of the piezoelectric substrate is not effectively used, and the transmission bandwidth of the filter cannot be increased.

A piezoelectric resonator having a small spurious resonance and a large difference ΔF between the resonant frequency and the antiresonant frequency has been considered in Japanese patent application number 8-110475. FIG. 39 is a view of a piezoelectric resonator having such a structure. In the piezoelectric resonator 4 shown in FIG. 39, a plurality of piezoelectric layers 6 and a plurality of electrodes 7 are alternately laminated to form a narrow base member 5, and the plurality of piezoelectric layers 6 are polarized in the longitudinal direction of the base member. This laminated piezoelectric resonator 4 is a stiffened type, and the piezoelectric layers 6 are arranged such that the vibration direction, the direction of polarization, and the direction in which an electrical field is applied are the same. Therefore, as compared with an unstiffened piezoelectric resonator, in which the vibration direction differs from the direction of polarization and electric field, the stiffened piezoelectric resonator has a larger electromechanical coupling coefficient and a larger frequency difference ΔF between the resonant frequency and the antiresonant frequency. In addition, vibrations in modes such as the width and thickness modes, which are different from the basic vibration, are unlikely to occur in the piezoelectric resonator 4 having the lamination structure described above and shown in FIG. 39.

In the piezoelectric resonator 4 having this lamination structure, the ends of the electrodes 7 are exposed at all side surfaces of the base member 5. Therefore, on a first side surface of the base member 5, the ends of alternate electrodes 7 are covered by insulating resin films 8a and an external electrode 9a is provided so as to be connected to the other alternate electrodes 7. On a second side surface of the base member 5, which is opposite to the first side surface, the ends of the second alternate electrodes 7 are covered by insulating resin films 8b and an external electrode 9b is arranged so as to be connected to the first alternate electrodes 7, on which the insulating resin films 8a are provided. The capacitance C between the external electrodes 9a and 9b is expressed by: C nS/T in the piezoelectric resonator 4 having this lamination structure, where S indicates the area of a cross section which is perpendicular to the longitudinal direction of the base member 5 or the area of the main surface of a piezoelectric layer 6, T indicates the thickness of a dielectric layer 6 or the distance between electrodes 7, and "n" indicates the number of layers between electrodes 7. Therefore, in the piezoelectric resonator 4 having this lamination structure, to obtain the same capacitance if the area S is decreased to reduce the size of the resonator, it is necessary to reduce T or increase "n." Since it is difficult to form the insulating resin films 8a and 8b precisely at a desired position in a compact piezoelectric resonator having a distance of, for example, 100 $\mu$m or less between electrodes 7 by a method such as printing, it is difficult to make a piezoelectric resonator having a substantially reduced and compact size and configuration.

Also in the piezoelectric resonator 4 having such a lamination structure, since the external electrodes 9a and 9b provided on the insulating resin films 8a and 8b have a different thermal expansion coefficient from that of the insulating resin films 8a and 8b, the external electrodes 9a, 9b may break, be fractured or damaged and possibly be partially or completely separated from the insulation resin films 8a and 8b as shown in FIG. 39 due to thermal shock or thermal cycling in a subsequent processing step.

SUMMARY OF THE INVENTION

To overcome the problems described above, the preferred embodiments of the present invention provide a piezoelectric resonator having a small spurious resonance and a large difference $\Delta F$ between the resonant frequency and the antiresonant frequency, which resonator is constructed to be exceptionally compact and in which an external electrode is constructed to avoid breaking and being damaged. The preferred embodiments of the present invention also provide an electronic component including such a novel piezoelectric resonator.

According to a preferred embodiment of the present invention, a piezoelectric resonator includes a base member having a length, a plurality of substantially planar-shaped inner electrodes disposed substantially perpendicularly to the length of the base member at intervals along the length of the base member; a first external electrode and a second external electrode disposed on a surface of the base member and connected to the plurality of inner electrodes, the base member including a plurality of laminated piezoelectric layers; the plurality of piezoelectric layers being polarized along the length of the base member; the plurality of inner electrodes disposed on surfaces of the plurality of piezoelectric layers which are substantially perpendicular to the length direction of the base member; a first group of the inner electrodes connected to a first external electrode and arranged so as not to be exposed at the portion where a second external electrode is disposed on a surface of the base member; and a second group of the inner electrodes connected to the second external electrode and arranged so as not to be exposed at a portion where the first external electrode is disposed on a surface of the base member.

In the piezoelectric resonator according to this preferred embodiment, a center axis or a center point of a shape formed by overlapping adjacent inner electrodes is preferably identical with a center axis or a center point of the base member on a plane which is substantially perpendicular to the length of the base member.

The first and second external electrodes may be provided on different side surfaces of the base member, respectively. Alternatively, the first and second external electrodes may also be provided on one common side surface of the base member.

The piezoelectric resonator preferably vibrates in a longitudinal vibration mode. The first and second external electrodes may be connected to the first and second groups of the inner electrodes, respectively and arranged to extend along the length of the base member on one side surface of the base member near one end and the other end viewed from the center in the width direction of the base member, respectively.

A groove may be formed along a length direction of the base member at the approximate center in the width direction on the side surface of the base member where the first and second external electrodes are located, and the first and second external electrodes may be located on one common side and the other side separated by the groove on the side surface of the base member, respectively.

Each of the first and second groups of inner electrodes may comprise a plurality of the inner electrodes, respectively.

The piezoelectric resonator according to preferred embodiments of the present invention may further include a mounting member disposed substantially at the center in the longitudinal direction of the base member.

The piezoelectric resonator may further include a support member and a mounting member disposed between the support member and a center portion of the base member in the longitudinal direction.

The preferred embodiments of the present invention further provide an electronic component including the above-described novel piezoelectric resonator, wherein the support member includes an insulating substrate on which a pattern electrode is disposed; the base member is mounted on the insulating substrate via the mounting member; and a cap is disposed on the insulating substrate so as to cover the base member. A plurality of the base members may be mounted on the insulating substrate via the mounting member so as to define a ladder filter.

The piezoelectric resonator according to a preferred embodiment of the present invention is a stiffened type and has piezoelectric layers in which the vibration direction, the direction of polarization, and the direction in which an electrical field is applied are the same. Therefore, as compared with an unstiffened piezoelectric resonator, in which the vibration direction differs from the direction of polarization and electrical field, the stiffened piezoelectric resonator has a larger electromechanical coupling coefficient and a larger frequency difference $\Delta F$ between the resonant frequency and the antiresonant frequency. In addition, vibrations in modes such as the width and thickness modes, which are different from longitudinal vibration, are unlikely to occur in the stiffened piezoelectric resonator.

In a piezoelectric resonator according to preferred embodiments of the present invention, since the electrodes connected to the first electrode of the pair of external electrodes are arranged so as not to be exposed at the portion where the second electrode of the pair of external electrodes is located on a surface of the base member and the electrodes connected to the second electrode of the pair of external electrodes are arranged so as not to be exposed at the portion where the first electrode of the pair of external electrodes is located on a surface of the base member, it is unnecessary to form an insulating resin film for insulating the ends of the electrodes on the surfaces of the base member. Therefore, the distance between the electrodes can be significantly reduced and the resonator can easily be made exceptionally compact.

In a piezoelectric resonator according to preferred embodiments of the present invention, since an insulating resin film is not disposed between a first external electrode and the electrodes electrically connected to a second external electrode or between the second external electrode and the electrodes electrically connected to the first external electrode, the external electrodes are unlikely to break or be damaged as a result of thermal shock and thermal cycling.

When electronic components such as an oscillator, a discriminator, and a filter are made using a piezoelectric resonator according to preferred embodiments of the present invention, the piezoelectric resonator is mounted on an insulating substrate on which pattern electrodes are provided and is covered by a cap to define chip-type electronic components.

Other features and advantages of the present invention will become apparent from the following description of the invention which refers to the accompanying drawings, wherein like reference numerals indicate like elements to avoid repetition.

DETAILED DESCRIPTION OF PREFERRED EMBODIMENTS

Figure 1:
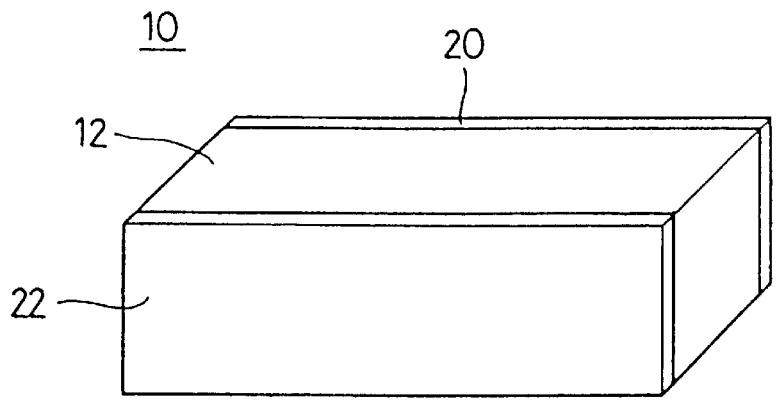
FIG. 1 is a perspective view of a piezoelectric resonator according to a preferred embodiment of the present invention.
Figure 2:
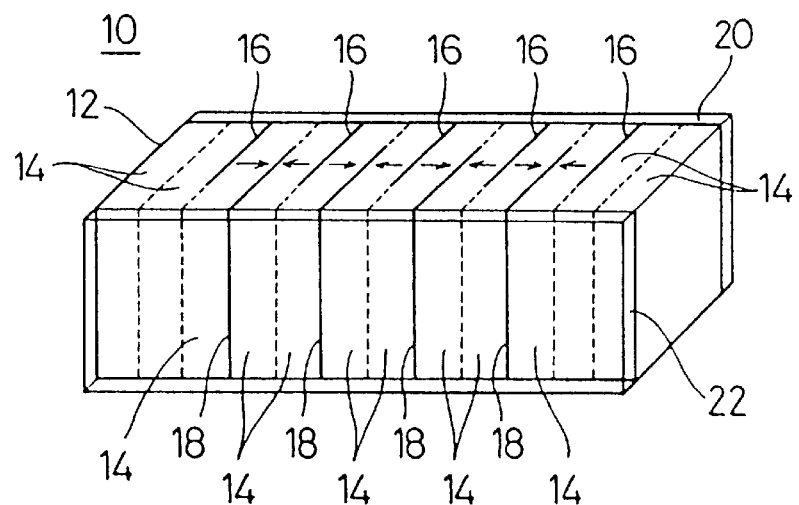
FIG. 2 is a view showing the structure of the piezoelectric resonator shown in FIG. 1.

FIG. 1 is a perspective view of a piezoelectric resonator according to a preferred embodiment of the present invention. FIG. 2 shows the internal structure of the piezoelectric resonator. The piezoelectric resonator 10 shown in FIGS. 1 and 2 preferably includes a substantially rectangular-parallelepiped-shaped base member 12 measuring, for example, about 3.8 mm by about 1 mm by about 1 mm. The base member 12 includes a plurality, for example, twelve, of laminated piezoelectric layers 14 made from, for example, piezoelectric ceramic material or other suitable material. The piezoelectric layers 14 are preferably constructed to have the same dimensions. A plurality, for example, eight, intermediate piezoelectric layers 14 are polarized in a longitudinal direction of the base member 12 such that adjacent piezoelectric layers 14 are polarized in opposing directions as shown by arrows in FIG. 2.

Figure 3A:
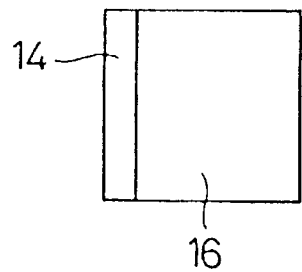
FIG. 3(a) is a plan view of an inner electrode used in the piezoelectric resonator shown in FIG. 1 and FIG. 2.
Figure 3B:
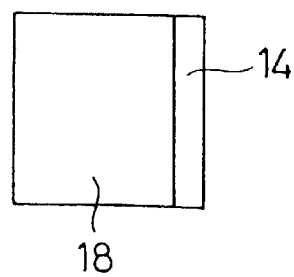
FIG. 3(b) is a plan view of an inner electrode used in the piezoelectric resonator shown in FIG. 1 and FIG. 2.

In the plurality of intermediate polarized layers 14, a first group of inner electrodes 16 and a second group of inner electrodes 18 are alternately disposed on main surfaces which are substantially perpendicular to the length of the base member 12. Therefore, the inner electrodes 16 and 18 are substantially perpendicular to the length of the base member 12 and are disposed along the length thereof at certain intervals. The first group of inner electrodes 16 are disposed on main surfaces of piezoelectric layers 14 except for a vertical strip section at one side as shown in FIG. 3(a). The second group of inner electrodes 18 are disposed on main surfaces of piezoelectric layers 14 except for a vertical strip section at the other side as shown in FIG. 3(b). Therefore, the first group of inner electrodes 16 are arranged so as to be exposed at three side surfaces of the base member 12, including a first side surface, and so as not to be exposed at the surface opposing the first side surface. The second group of inner electrodes 18 are arranged so as not to be exposed at the first side surface and so as to be exposed at three side surfaces, including the surface opposing the first side surface.

On the first side surface and the other opposing side surface of the base member 12, first and second external electrodes 20 and 22 are provided, respectively. Therefore, the external electrode 20 is connected to the electrodes 16, and the external electrode 22 is connected to the electrodes 18.

The piezoelectric resonator 10 uses the first and second external electrodes 20 and 22 as input and output electrodes. The plurality of intermediate piezoelectric layers 14, excluding a certain number, for example, four, piezoelectric layers 14 at both ends of the resonator, in the base member 12, are piezoelectrically active because an electric field is applied between adjacent inner electrodes 16 and 18 by applying a signal to the external electrodes 20 and 22. In this case, since voltages are applied in opposite directions to the piezoelectric layers 14 polarized in opposite directions in the base member 12, the piezoelectric layers 14 expand and contract in the same direction as a whole, single unitary body. In other words, with the use of the first and second group of inner electrodes 16 and 18 connected to the first and second external electrodes 20 and 22, an AC electric field is applied to each piezoelectric layer 14 in the length direction of the base member 12 to generate a driving force for expansion and contraction in each piezoelectric layer 14. Therefore, the basic vibration is excited in the entire piezoelectric resonator 10 in a longitudinal vibration mode with a vibration node where no vibration occurs being located at an approximate center of the base member 12 along the length direction thereof.

In the piezoelectric resonator 10, the polarization direction of the piezoelectric layers 14, the applied electric field direction created by an input signal, and the direction of vibration in the piezoelectric layers 14 are preferably all the same. In other words, the piezoelectric resonator 10 is a stiffened type resonator. The piezoelectric resonator 10 has a larger electromagnetic coupling coefficient than an unstiffened piezoelectric resonator, in which the direction of vibration differs from the direction of polarization and electric field. Therefore, the piezoelectric resonator 10 has a larger frequency difference ΔF between the resonant frequency and the antiresonant frequency than the conventional unstiffened piezoelectric resonator. This means that the piezoelectric resonator 10 obtains wide-frequency-band characteristics as compared with the conventional unstiffened piezoelectric resonator.

Figure 4:
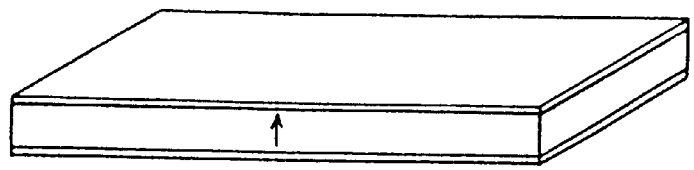
FIG. 4 is a perspective view of an unstiffened piezoelectric resonator which vibrates in the longitudinal direction, shown for comparison.
Figure 5:
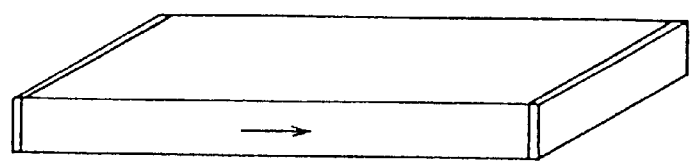
FIG. 5 is a perspective view of a stiffened piezoelectric resonator which vibrates in the longitudinal direction.
Figure 6:
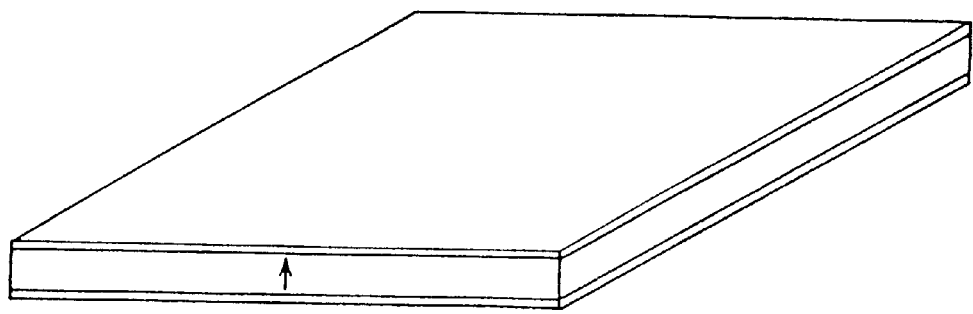
FIG. 6 is a perspective view of an unstiffened piezoelectric resonator which vibrates in the square-type vibration mode, shown for comparison.

To measure differences between stiffened and unstiffened piezoelectric resonators, examples of piezoelectric resonators shown in FIGS. 4, 5, and 6 were made. The piezoelectric resonator shown in FIG. 4 was made by arranging electrodes on both surfaces in the thickness direction of a piezoelectric substrate measuring approximately 4.0 mm by 1.0 mm by 0.38 mm. This piezoelectric resonator was polarized in the thickness direction and vibrated in the longitudinal direction when a signal was applied to the electrodes.

The piezoelectric resonator shown in FIG. 5 had the same dimensions as the piezoelectric resonator shown in FIG. 4. Electrodes were provided on both surfaces in the longitudinal direction of a piezoelectric substrate. The piezoelectric resonator was polarized in the longitudinal direction and vibrated in the longitudinal direction when a signal was applied to the electrodes. The piezoelectric resonator shown in FIG. 6 was made by providing electrodes on both surfaces in the thickness direction of a piezoelectric substrate measuring approximately 4.7 mm by 4.7 mm by 0.38 mm. This piezoelectric resonator was polarized in the thickness direction and vibrated in the plane direction when a signal was applied to the electrodes. The piezoelectric resonators shown in FIGS. 4 and 6 were of an unstiffened type and the piezoelectric resonator shown in FIG. 5 was a stiffened type.

The resonant frequency Fr and the electromechanical coupling coefficient K of each of these piezoelectric resonators were measured and the results are shown in Tables 1, 2, and 3. Table 1 indicates the measured results of the piezoelectric resonator shown in FIG. 4. Table 2 indicates the measured results of the piezoelectric resonator shown in FIG. 5. Table 3 indicates the measured results of the piezoelectric resonator shown in FIG. 6.

TABLE 1

|  | Basic longitudinal vibration | Longitudinal third-harmonic vibration | Width-mode vibration |
| --- | --- | --- | --- |
| Resonant frequency (MHz) | 0.460 | 1.32 | 1.95 |
| Electro-mechanical coupling coefficient (%) | 18.9 | 3.9 | 25.2 |

TABLE 2

|  | Basic longitudinal vibration | Longitudinal third-harmonic vibration | Width-mode vibration |
| --- | --- | --- | --- |
| Resonant frequency (MHz) | 0.455 | 1.44 | 1.96 |
| Electro-mechanical coupling coefficient (%) | 42.9 | 12.2 | 4.0 |

TABLE 3

|  | Basic square-type vibration | Square-type third-harmonic vibration | Thickness-mode vibration |
| --- | --- | --- | --- |
| Resonant frequency (MHz) | 0.458 | 1.25 | 5.65 |
| Electro-mechanical coupling coefficient (%) | 35.0 | 11.5 | 23.3 |

It is understood from the measurement data in the above tables that a stiffened piezoelectric resonator has a larger electromagnetic coupling coefficient K than an unstiffened piezoelectric resonator, and therefore has a larger frequency difference ΔF between the resonant frequency and the anti-resonant frequency. The largest spurious vibration in a stiffened piezoelectric resonator is a longitudinal third-harmonic type and the electromagnetic coupling coefficient K is 12.2% during vibration. During width-mode vibration, which is different from basic vibration, the electromagnetic coupling coefficient K is as small as 4.0%. In contrast, the electromagnetic coupling coefficient K during width-mode vibration is as large as 25.2% in an unstiffened longitudinal-vibration piezoelectric resonator. In an unstiffened square-type vibration piezoelectric resonator, the electromagnetic coupling coefficient K is as large as 23.3% while vibrating in a thickness-mode vibration. Therefore, it is understood that a stiffened piezoelectric resonator has smaller spurious vibrations than an unstiffened piezoelectric resonator.

Figure 39:
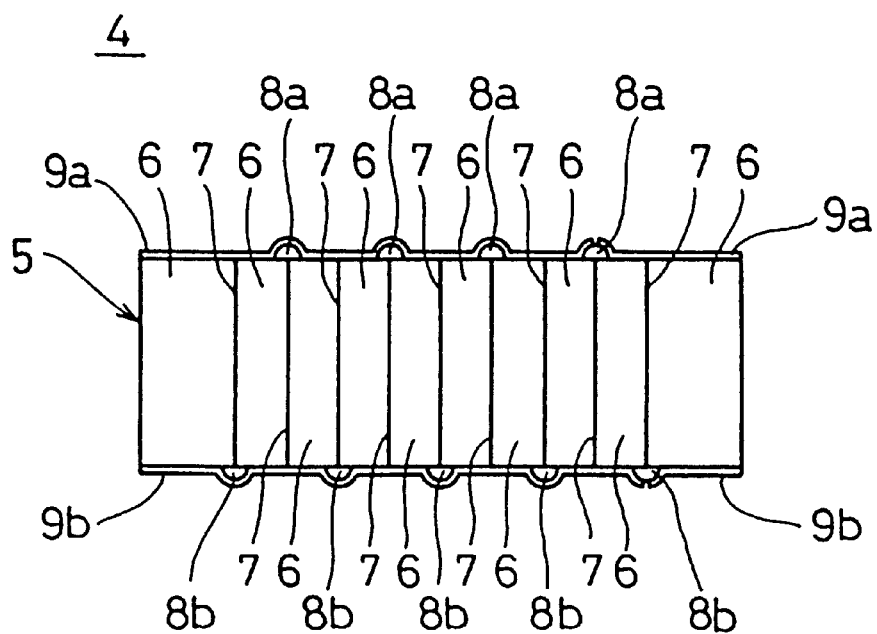
FIG. 39 is a view of a piezoelectric resonator having a lamination structure, which is provides a background for the present invention.

In the piezoelectric resonator 10 shown in FIG. 1 and FIG. 2, as compared with the piezoelectric resonator 4 having the lamination structure shown in FIG. 39, since the first group of inner electrodes 16 connected to the first external electrode 20 are arranged so as not to be exposed at the side surface of the base member 12 where the second external electrode 22 is located, and the second group of inner electrodes 18 connected to the second external electrode 22 are arranged so as not to be exposed at the side surface of the base member 12 where the first external electrode 20 is located, it is not necessary to form an insulating resin film for insulating the ends of the inner electrodes 16 and 18 on the side surfaces of the base member 12. Therefore, the distance between the inner electrodes 16 and 18 can be reduced significantly and the resonator can easily be made exceptionally compact.

In the piezoelectric resonator 10, as compared with the piezoelectric resonator 4 having the lamination structure shown in FIG. 39, since an insulating resin film is not disposed between the base member 12 and the external electrodes 20 and 22, the external electrodes 20 and 22 are unlikely to break or be damaged as a result of thermal shock and thermal cycling.

Figure 40:
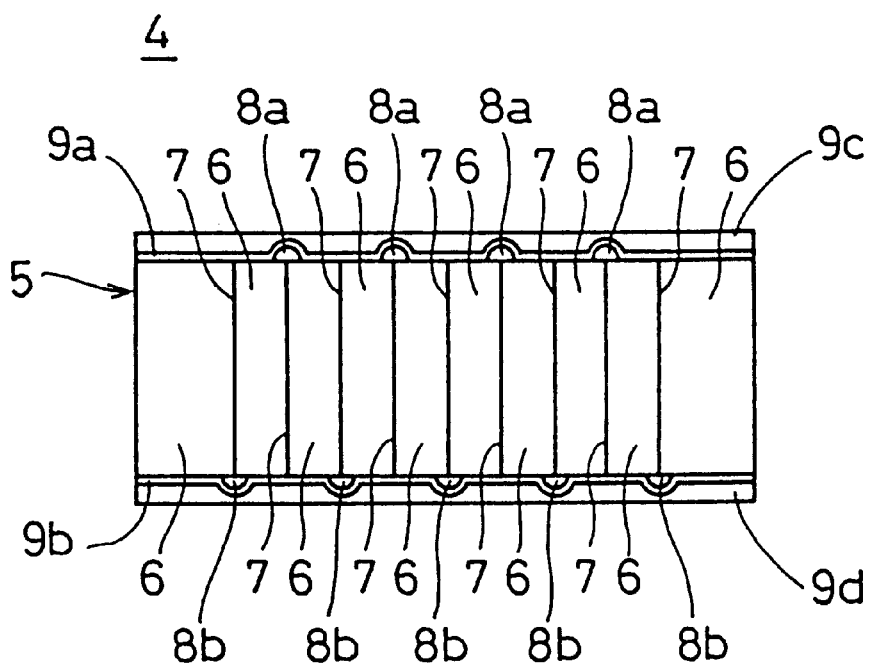
FIG. 40 is a view of a state in which electrically conductive resin layers are disposed on surfaces of the external electrodes of the piezoelectric resonator shown in FIG. 39.

To make the external electrodes 9a and 9b provided on the insulating resin films 8a and 8b unlikely to break in the piezoelectric resonator 4 having the lamination structure shown in FIG. 39, it has been attempted that electrically conductive resin layers 9c and 9d are arranged on the surfaces of the external electrodes 9a and 9b as shown in FIG. 40. When the insulating resin films 8a and 8b and the electrically conductive resin layers 9c and 9d are disposed on the side surfaces of the base member 5, however, a large load mass is created on the side surfaces of the base member 5 which reduces the mechanical quality coefficient Qm and increases the voltage dependency of the resonant frequency. Conversely, in the piezoelectric resonator 10, since such a load mass created by resin films is not provided on the side surfaces of the base member 12, the mechanical quality coefficient Qm does not deteriorate and the voltage dependency of the resonant frequency does not increase.

Figure 3C:
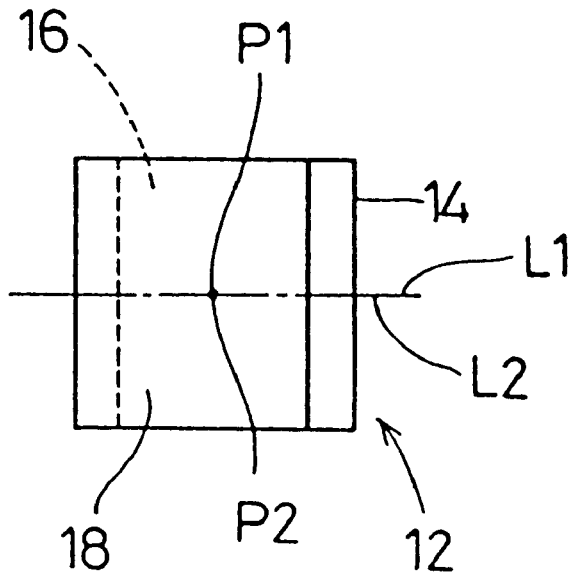
FIG. 3(c) is a view illustrating the center axis and the center point of the base member in the piezoelectric resonator shown in FIG. 1 and FIG. 2 and the center axis and the center line of opposing portions in electrodes.

Since the piezoelectric resonator 10 is formed such that the center axis L1 or the center point P1 of the shape formed by overlapping the electrodes 16 and 18 is preferably substantially the same as the center axis L2 or the center point P2 of a plane which is substantially perpendicular to the longitudinal direction of the base member 12 as shown in FIG. 3(c), a driving force generated in the piezoelectric layers 14 is not misaligned relative to the center axis of the base member 12, and the base member 12 is hardly bent. Therefore, a spurious resonance due to bending in the base member 12 is unlikely to occur and unacceptable characteristics are also unlikely to be obtained.

Since the inner electrodes 16 and 18 are partially formed on main surfaces of piezoelectric layers 14 in the piezoelectric resonator 10, ΔF can be adjusted by adjusting the opposing area of the inner electrodes 16 and 18. The degree of freedom in designing resonator characteristics is therefore advantageously large.

In the piezoelectric resonator 10, the electric capacitance of the resonator can be adjusted by changing the opposing area of the inner electrodes 16 and 18, the number of the piezoelectric layers 14 and the number of the inner electrodes 16 and 18, or the dimensions of the piezoelectric layers 14 in the longitudinal direction of the base member 12. In other words, the electric capacitance can be increased by increasing the opposing area of the inner electrodes 16 and 18, by increasing the number of the piezoelectric layers 14 or the number of the inner electrodes 16 and 18, or by reducing the dimensions of the piezoelectric layers 14 in the longitudinal direction of the base member 12.

In contrast, the electric capacitance can be reduced by reducing the opposing area of the inner electrodes 16 and 18, by reducing the number of the piezoelectric layers 14 or the number of the inner electrodes 16 and 18, or by increasing the dimensions of the piezoelectric layers 14 in the longitudinal direction of the base member 12. Therefore, by changing the opposing area of the inner electrodes 16 and 18, the number of the piezoelectric layers 14 or the number of the inner electrodes 16 and 18, or the dimensions of the piezoelectric layers 14 in the longitudinal direction of the base member 12, the electric capacitance is adjusted. This means that a high degree of freedom in capacitance design is achieved. Therefore, it is easy to achieve impedance matching with an external circuit when the piezoelectric resonator 10 is mounted on a circuit board.

Even when the vertical dimension of the piezoelectric resonator 10 is reduced with the width of the portions where the inner electrodes 16 and 18 are not disposed on main surfaces of the piezoelectric layers 14 being the same, in order to maintain insulation at the ends of the inner electrodes 16 and 18, the ratio of the opposing area of the inner electrodes 16 and 18 to the area of a main surface of the piezoelectric layers 14 does not change. Therefore, a low-profile piezoelectric resonator can be made without reducing the efficiency of the driving force generated in the piezoelectric layers 14.

Figure 7A:
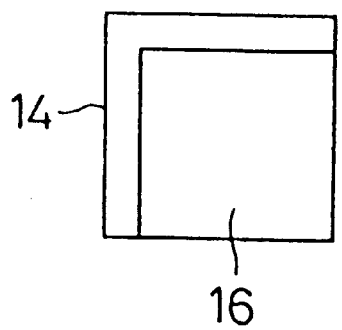
FIG. 7(a) is a plan view of a modifications of the electrode used in the piezoelectric resonator shown in FIG. 1 and FIG. 2.
Figure 7B:
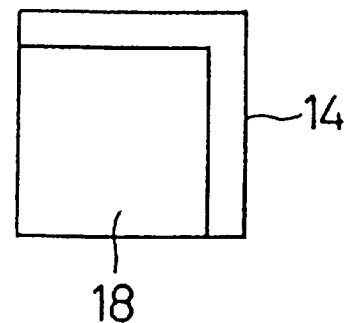
FIG. 7(b) is a plan view of a modifications of the electrode used in the piezoelectric resonator shown in FIG. 1 and FIG. 2.

The piezoelectric resonator 10 shown in FIG. 1 and FIG. 2 may be configured such that the inner electrodes 16 are disposed on main surfaces of the piezoelectric layers 14 except for two side portions of the upper side and one vertical side adjacent thereto as shown in FIG. 7(a) and the inner electrodes 18 are disposed on main surfaces of the piezoelectric layers 14 except for two side portions of the upper side and the other vertical side adjacent thereto as shown in FIG. 7(b).

Figure 8A:
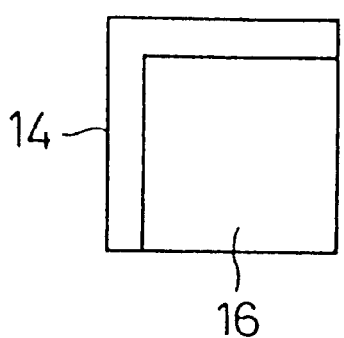
FIG. 8(a) is a plan view of another modification of the electrode used in the piezoelectric resonator shown in FIG. 1 and FIG. 2.
Figure 8B:
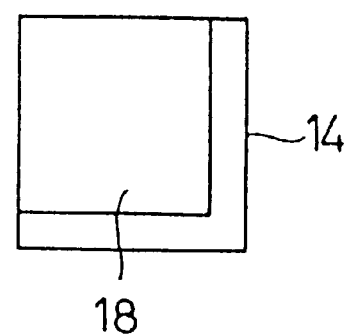
FIG. 8(b) is a plan view of another modification of the electrode used in the piezoelectric resonator shown in FIG. 1 and FIG. 2.

The piezoelectric resonator 10 shown in FIG. 1 and FIG. 2 may be configured such that the electrodes 16 are disposed on main surfaces of the piezoelectric layers 14 other than two adjacent side portions as shown in FIG. 8(a) and the electrodes 18 are disposed on main surfaces of the piezoelectric layers 14 other than the other two adjacent side portions as shown in FIG. 8(b).

Figure 9:
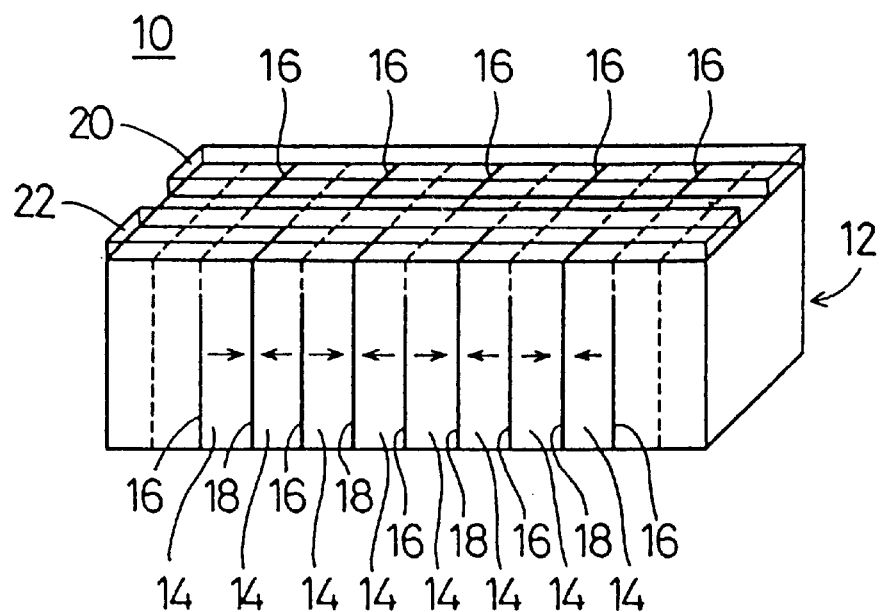
FIG. 9 is a view of another piezoelectric resonator according to another preferred embodiment of the present invention.

FIG. 9 is a view of another piezoelectric resonator according to preferred embodiments of the present invention. The piezoelectric resonator shown in FIG. 9 is different from the piezoelectric resonator shown in FIG. 1 and FIG. 2 in the structure and arrangement of inner electrodes 16 and 18 and the external electrodes 20 and 22.

Figure 10A:
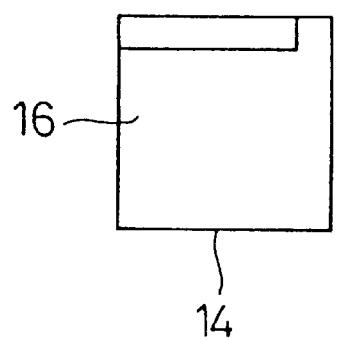
FIG. 10(a) is a plan view of an electrode used in the piezoelectric resonator shown in FIG. 9.
Figure 10B:
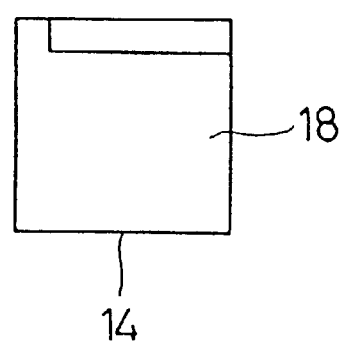
FIG. 10(b) is a plan view of an electrode used in the piezoelectric resonator shown in FIG. 9.

Specifically, in the piezoelectric resonator 10 shown in FIG. 9, the first group of inner electrodes 16 are disposed on main surfaces of piezoelectric layers 14 except for the portion from the middle section at the upper side to one end as shown in FIG. 10(a) and the second group of inner electrodes 18 are disposed on main surfaces of piezoelectric layers 14 except for the portion from the middle section at the upper side to the other end as shown in FIG. 10(b). In other words, the first group of inner electrodes 16 are arranged so as not to be exposed at a location extending from the middle to one end in the width direction on the upper side surface of the base member 12 and so as to be exposed at the other end. The second group of inner electrodes 18 are arranged so as to be exposed at one end in the width direction on the upper side surface of the base member 12 and so as not to be exposed from the middle to the other end.

First and second external electrodes 20 and 22 are arranged in two lines in the length direction of the base member 12 on the upper side surface of the base member 12 at one end and the other end viewed from the center in the width direction of the base member 12. In this case, the first external electrode 20 is connected to the first group of inner electrodes 16 and the second external electrode 22 is connected to the second group of inner electrodes 18.

The piezoelectric resonator 10 shown in FIG. 9 has another advantage. As compared with the piezoelectric resonator shown in FIG. 1 and FIG. 2, even when the dimension of the piezoelectric resonator 10 is reduced in the width direction with the width of the portions where the first and second group of inner electrodes 16 and 18 are not disposed on main surfaces of the piezoelectric layers 14 being the same, in order to maintain insulation at the ends of the first and second group of inner electrodes 16 and 18, since the ratio of the opposing area of the first and second group of inner electrodes 16 and 18 to the area of a main surface of the piezoelectric layers 14 does not change, the size of the piezoelectric resonator can be reduced in the width direction without reducing the efficiency of the driving force generated in the piezoelectric layers 14.

A manufacturing method for the piezoelectric resonator 10 shown in FIG. 9 will be described next.

Figure 11:
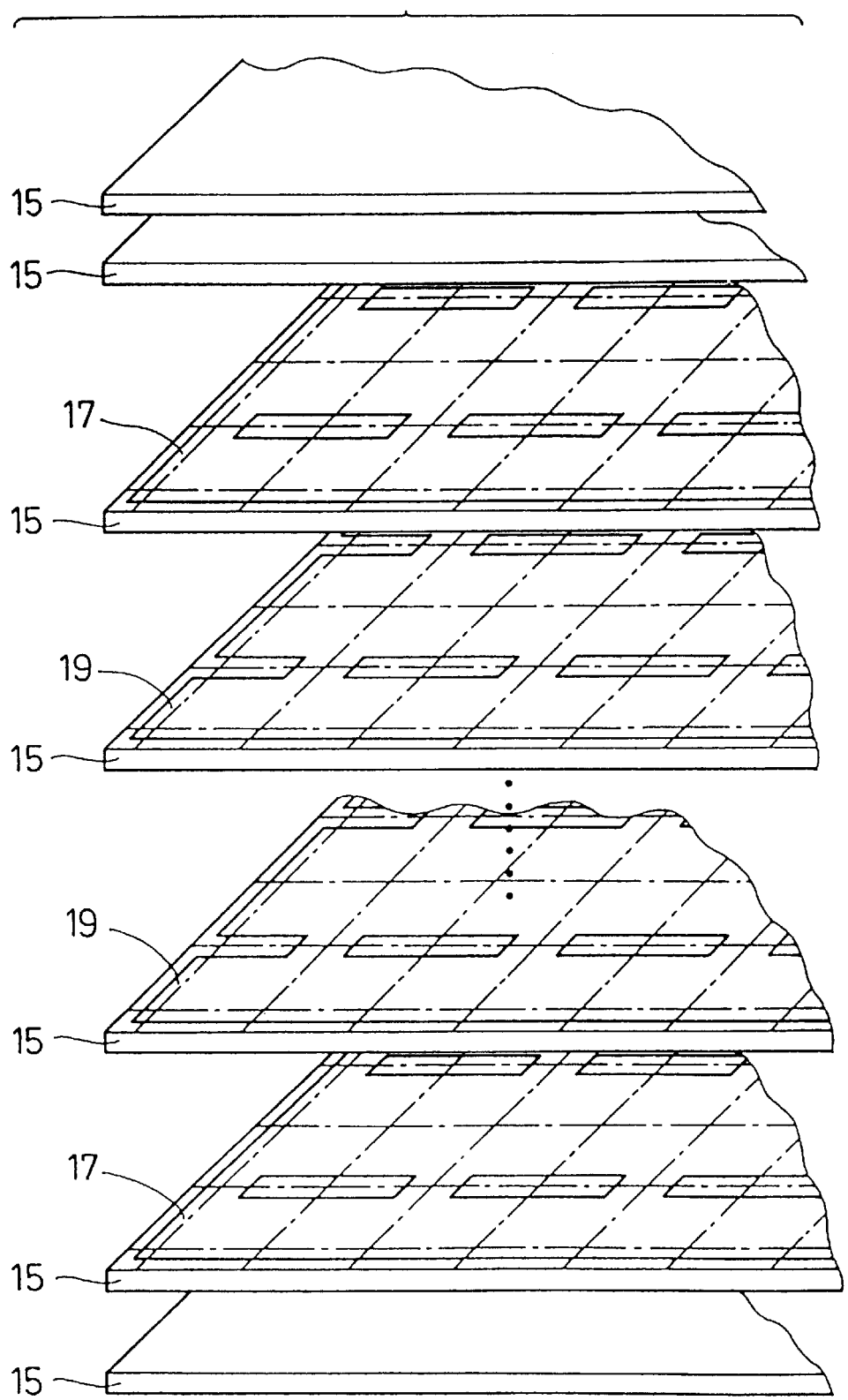
FIG. 11 is a view of the main section of motherboards used for manufacturing the piezoelectric resonator shown in FIG. 9.

As shown in FIG. 11, a plurality, for example, twelve, piezoelectric ceramic motherboards 15 are prepared. On one main surface of each of five mother boards 15, one of a plurality of mother electrodes 17, which will serve as a plurality of the first group of inner electrodes 16, is formed. On one main surface of each of another four mother boards 15, one of plurality of mother electrodes 19, which will serve as a plurality of second group of inner electrodes 18, is formed. No electrode is formed on the remaining three motherboards 15. These motherboards 15 are laminated to form a laminated member. The laminated member is cut along the one-dot chain lines extending in the transverse direction in FIG. 11.

Figure 12:
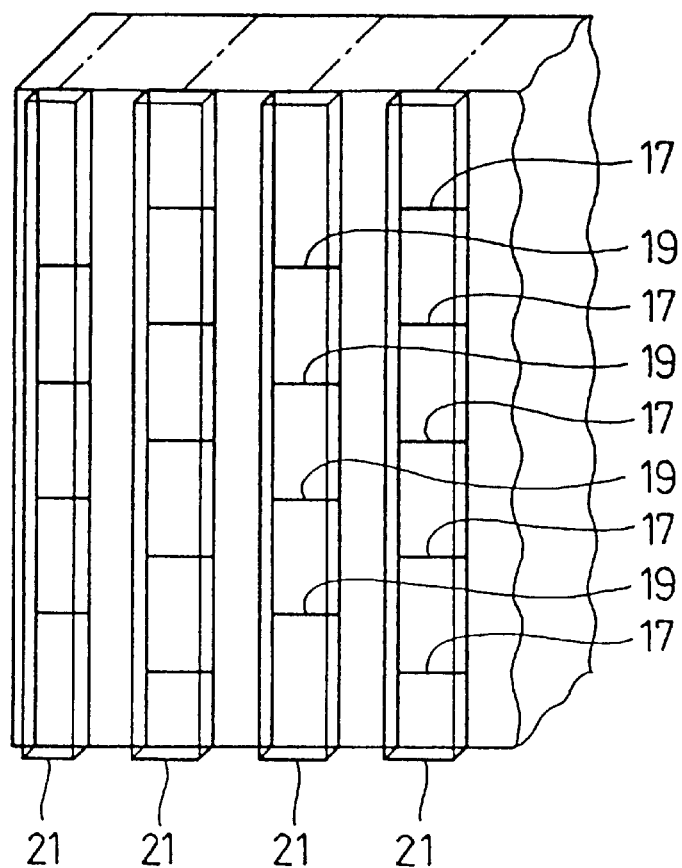
FIG. 12 is a view of the main section of external electrodes used for manufacturing the piezoelectric resonator shown in FIG. 9.

On a cutting surface of the cut laminated member, as shown in FIG. 12, electrodes 21, which will serve as the external electrodes 20 and 22, are formed. Each motherboard 15 or each piezoelectric layer 14 is polarized by applying a high DC voltage to adjacent electrodes 21. The laminated member is cut along the one-dot chain lines shown in FIG. 12 to form the piezoelectric resonators 10. Piezoelectric resonators having an arrangement and construction other than that specifically shown in FIG. 9 can be made in the same way.

Figure 13A:
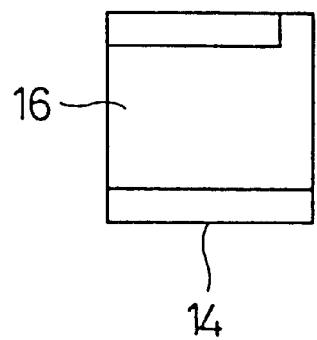
FIG. 13(a) is a plan view of a modification of an electrode used in the piezoelectric resonator shown in FIG. 9.
Figure 13B:
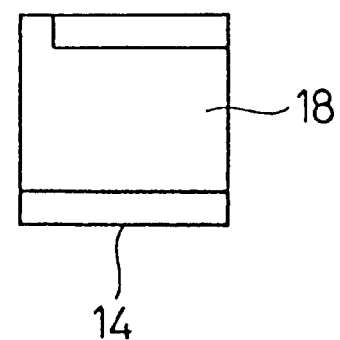
FIG. 13(b) is a plan view of a modification of an electrode used in the piezoelectric resonator shown in FIG. 9.
Figure 13C:
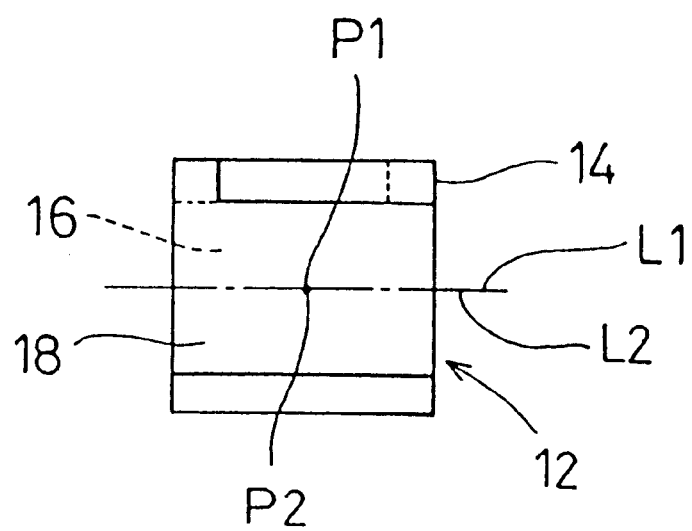
FIG. 13(c) is a view illustrating the center axis and the center point of the base member and the center axis and the center line of opposing portions of the first and second electrodes in the piezoelectric resonator using the first and second electrodes shown in FIG. 10.
Figure 13D:
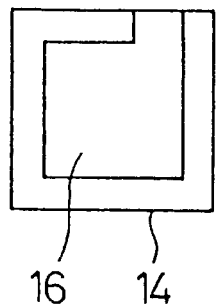
FIG. 13(d) and 13(e) are views of other modifications of the first and second group of inner electrodes used in the piezoelectric resonator shown in FIG. 9.
Figure 13E:
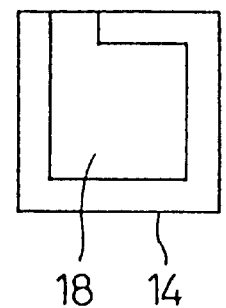

The piezoelectric resonator 10 shown in FIG. 9 may be configured such that the inner electrodes 16 are formed on main surfaces of piezoelectric layers 14 except for the portion extending from the middle section at the upper side to one end and the lower side as shown in FIG. 13(a), and the second group of inner electrodes 18 have the reflected image of the electrodes 16 and are formed on main surfaces of piezoelectric layers 14 except for the portion extending from the middle section at the upper side to the other end and the lower side as shown in FIG. 13(b).

Since the piezoelectric resonator 10 having the first and second group of inner electrodes 16 and 18 shown in FIG.

10(*a*) and FIG. 10(*b*) is formed such that the center axis L1 or the center point P1 of the shape formed by overlapping the first and second electrodes 16 and 18 is preferably substantial the same as the center axis L2 or the center point P2 of a plane which is substantially perpendicular to the length direction of the base member 12 as shown in FIG. 13(*c*), a driving force generated in the piezoelectric layers 14 is not misaligned with respect to the center axis of the base member 12, and the base member 12 is hardly bent. Therefore, the resonator has another advantage. A spurious resonance due to bending in the base member 12 is unlikely to occur and unacceptable characteristics caused thereby are also unlikely to be obtained.

The piezoelectric resonator 10 shown in FIG. 1 may be configured such that the first group of inner electrodes 16 are not located at three sides of piezoelectric layers 14, excluding the upper side, as shown in FIG. 13(*d*), and the second group of inner electrodes 18 have the reflected image of the first group of inner electrodes 16 and are not located at three sides on main surfaces of piezoelectric layers 14, excluding the upper side where the external electrodes are located, as shown in FIG. 13(*e*). When the first and second group of inner electrodes 16 and 18 are formed in this way, since the first and second group of inner electrodes 16 and 18 are not exposed on the surfaces of the piezoelectric resonator 10 at all, the resonator has another advantage. The moisture-proofness or water-resistance of the first and second group of inner electrodes 16 and 18 is increased and the insulation resistance between the first and second group of inner electrodes 16 and 18 is unlikely to decrease.

Figure 14A:
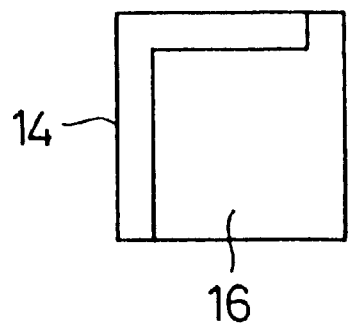
FIG. 14(a) and 14(b) are plan views of modifications of electrodes used in the piezoelectric resonators shown in FIG. 1, FIG. 2, and FIG. 9.
Figure 14B:
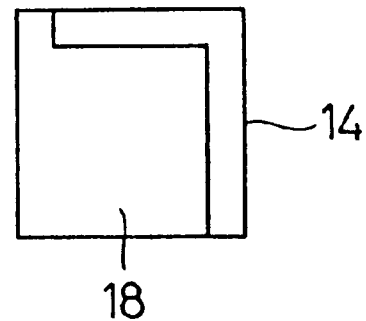
Figure 15A:
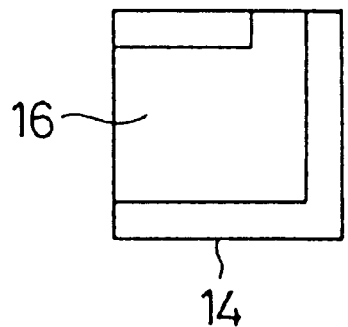
FIG. 15(a), 15(b), 15(c), 15(d), 15(e), 15(f), 15(g) and 15(h) are plan views of other modifications of electrodes used in the piezoelectric resonators shown in FIG. 1, FIG. 2, and FIG. 9.
Figure 15B:
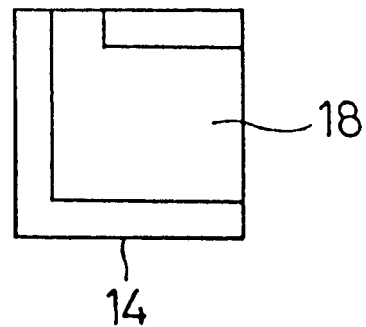
Figure 15C:
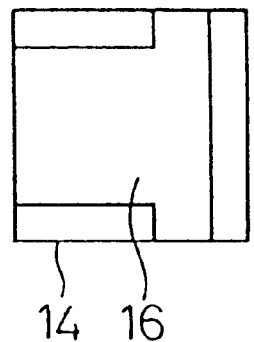
Figure 15D:
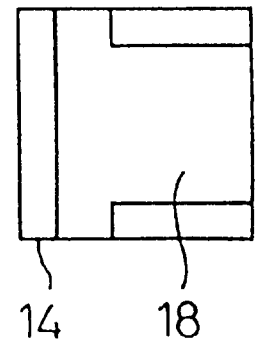
Figure 15E:
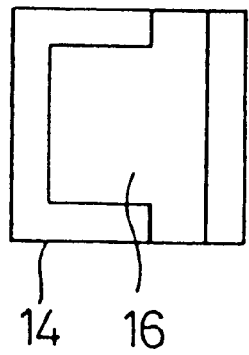
Figure 15F:
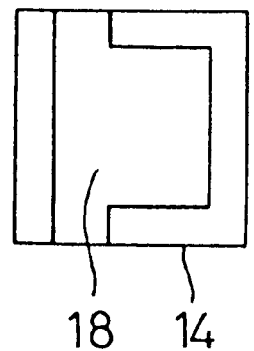
Figure 15G:
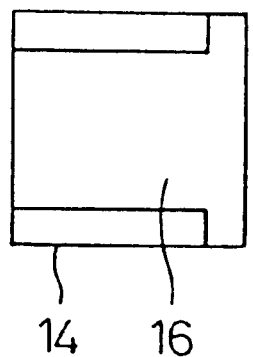
Figure 15H:
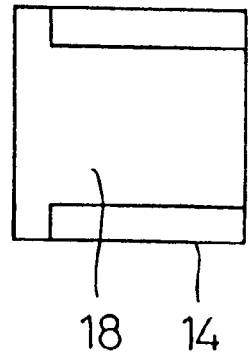

The piezoelectric resonator 10 shown in FIG. 1 may be configured such that the first group of inner electrodes 16 are located on main surfaces of piezoelectric layers 14 except for the portion extending from the middle section at the upper side to one end and a vertical side portion adjacent thereto as shown in FIG. 14(*a*), and the second group of inner electrodes 18 have the reflected image of the first electrodes 16 and are located on main surfaces of piezoelectric layers 14 except for the portion extending from the middle section at the upper side to the other end and the other vertical side portion adjacent thereto as shown in FIG. 14(*b*).

The piezoelectric resonator 10 shown in FIG. 1 may be configured such that the first group of inner electrodes 16 are located on main surfaces of piezoelectric layers 14 extending from the middle section at the upper side to the middle section of a vertical side adjacent thereto as shown in FIG. 15(*a*), and the second group of inner electrodes 18 have the reflected image of the first group of inner electrodes 16 and are located on main surfaces of piezoelectric layers 14 extending from the middle section at the upper side to the middle section of the other vertical side adjacent thereto as shown in FIG. 15(*b*).

The piezoelectric resonator 10 shown in FIG. 1 may be formed such that the first group of inner electrodes 16 are located on main surfaces of piezoelectric layers 14 extending from the center to the middle of each of three sides, the upper side, the lower side, and one vertical side, as shown in FIG. 15(*c*), and the second group of inner electrodes 18 have the reflected image of the first group of inner electrodes 16 and are located on main surfaces of piezoelectric layers 14 extending from the center to the middle of each of three sides, the other vertical side, the upper side, and the lower side as shown in FIG. 15(*d*).

The piezoelectric resonator 10 shown in FIG. 1 may be configured such that the first group of inner electrodes 16 are located on main surfaces of piezoelectric layers 14 extending from the center to the middle of each of the upper and the lower sides without reaching the vertical portions at both sides of the piezoelectric layers 14 as shown in FIG. 15(*e*), and the second group of inner electrodes 18 have the reflected image of the first group of inner electrodes 16 and are located on main surfaces of piezoelectric layers 14 extending from the center to the middle of each of the upper and lower sides without reaching the vertical portions at both sides of the piezoelectric layers 14 as shown in FIG. 15(*f*).

The piezoelectric resonator 10 shown in FIG. 1 may be configured such that the first group of inner electrodes 16 are located on main surfaces of piezoelectric layers 14 extending from the center to the vertical portions at both sides as shown in FIG. 15(*g*), and the second group of inner electrodes 18 have the reflected image of the first group of inner electrodes 16 and are located on main surfaces of piezoelectric layers 14 extending from the center to the vertical portions at both sides as shown in FIG. 15(*h*).

When the first and second group of inner electrodes 16 and 18 are arranged as shown in FIG. 13(*a*),13(*b*) or FIG. 15(*g*),15(*h*), even if the dimension of the piezoelectric resonator is reduced in the width direction with the width of the portions where the first or second electrodes 16 or 18 are not located on main surfaces of the piezoelectric layers 14 being the same, in order to maintain insulation at the ends of the first and second group of inner electrodes 16 and 18, since the ratio of the opposing area of the first and second group of inner electrodes 16 and 18 to the area of a main surface of the piezoelectric layers 14 does not change, the size of the piezoelectric resonator can be reduced in the width direction without reducing the efficiency of the driving force generated in the piezoelectric layers 14.

When the first and second group of inner electrodes 16 and 18 are arranged as shown in FIG. 13(*e*), 13(*f*) and FIG. 15(*a*)–15(*h*), since the piezoelectric resonator is formed such that the center axis or the center point of the shape formed by overlapping the first and second group of inner electrodes 16 and 18 is substantially the same as the center axis or the center point of a plane which is substantially perpendicular to the longitudinal direction of the base member 12, a driving force generated in the piezoelectric layers 14 is not misaligned with respect to the center axis of the base member 12, and the base member 12 is hardly bent. Therefore, the resonator has another advantage. A spurious resonance due to bending in the base member 12 is unlikely to occur and unacceptable characteristics are also unlikely to be obtained. In these preferred embodiments, the shapes of opposing portions of the first and second group of inner electrodes 16 and 18 are preferably symmetric relative to a main surface of piezoelectric layers 14.

In each piezoelectric resonator 10 described above, the middle portion located along the length direction of the base member 12 is piezoelectrically active and vibrates. Both ends of the base member 12 preferably have inactive sections defined thereat and are therefore not piezoelectrically active. Only when the piezoelectric layers are polarized and an electric field is applied does the portion become piezoelectrically active, otherwise it remains piezoelectrically inactive.

Figure 16:
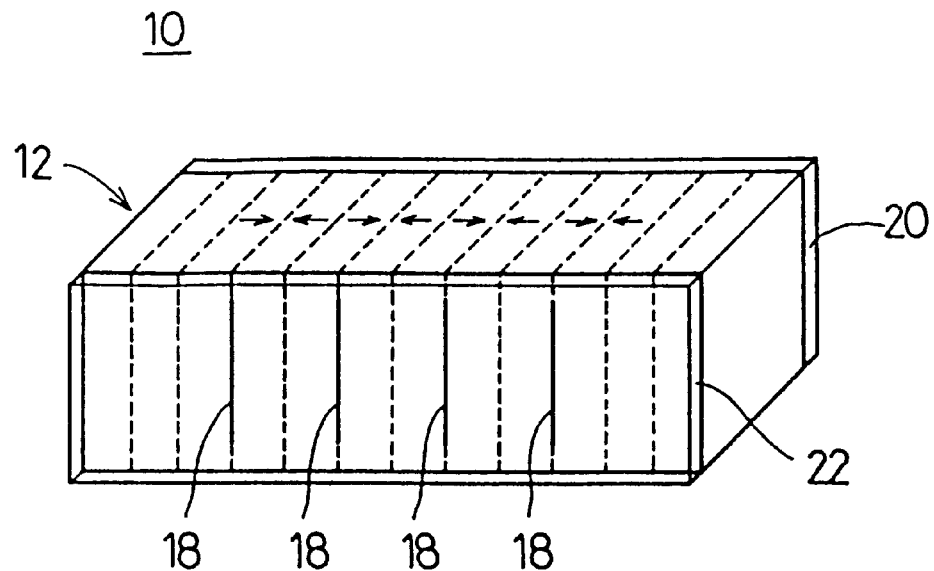
FIG. 16 is a view of still another piezoelectric resonator according to a preferred embodiment of the present invention.

FIG. 16 is a view of still another piezoelectric resonator according to preferred embodiments of the present invention. The piezoelectric resonator shown in FIG. 16 is different from the piezoelectric resonator shown in FIG. 1 and FIG. 2 in the shape of the electrodes 16 and 18.

Figure 17A:
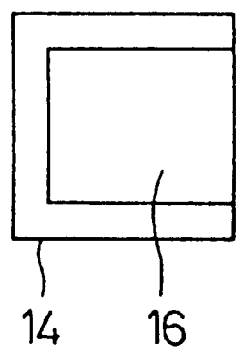
FIG. 17(a) and 17(b) are views of electrodes used in the piezoelectric resonator shown in FIG. 16.
Figure 17B:
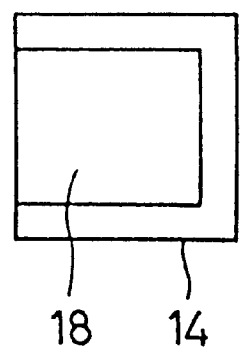

In the piezoelectric resonator 10 shown in FIG. 16, the inner electrodes 16 are located on main surfaces of piezoelectric layers 14 extending from the center to the middle of one vertical side as shown in FIG. 17(a), and the inner electrodes 18 have the reflected image of the inner electrodes 16 and are located on main surfaces of piezoelectric layers 14 extending from the center to the middle of the other vertical side as shown in FIG. 17(b). Although not shown in FIG. 16, a first external electrode 20 is connected to the first group of inner electrodes 16 and a second external electrode 22 is connected to the second group of inner electrodes 18.

In the piezoelectric resonator 10 shown in FIG. 16, since the inner electrodes 16 and 18 are not exposed at all at the surfaces of the resonator, the moisture-proofness and water-resistant quality of the inner electrodes 16 and 18 is increased and the insulation resistance between the inner electrodes 16 and 18 is unlikely to decrease.

Figure 18A:
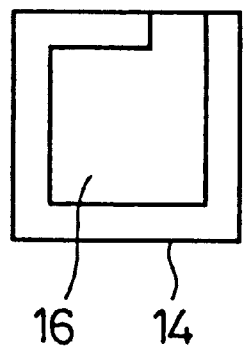
FIG. 18(a) and 18(b) are views of other modifications of the electrodes used in the piezoelectric resonator shown in FIG. 9.
Figure 18B:
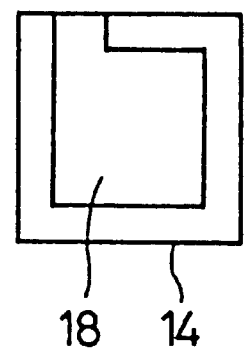

The piezoelectric resonator 10 shown in FIG. 9 may be configured such that the inner electrodes 16 are not formed at three sides of piezoelectric layers 14, excluding the upper side, as shown in FIG. 18(a), and the inner electrodes 18 have the reflected image of the inner electrodes 16 and are not formed at three sides on main surfaces of piezoelectric layers 14, excluding the upper side as shown in FIG. 18(b). Even when the inner electrodes 16 and 18 are formed in this way, the moisture-proofness and water-resistant quality of the inner electrodes 16 and 18 is increased and the insulation resistance between the inner electrodes 16 and 18 is unlikely to decrease in the same way as the piezoelectric resonator 10 shown in FIG. 16.

Figure 19:
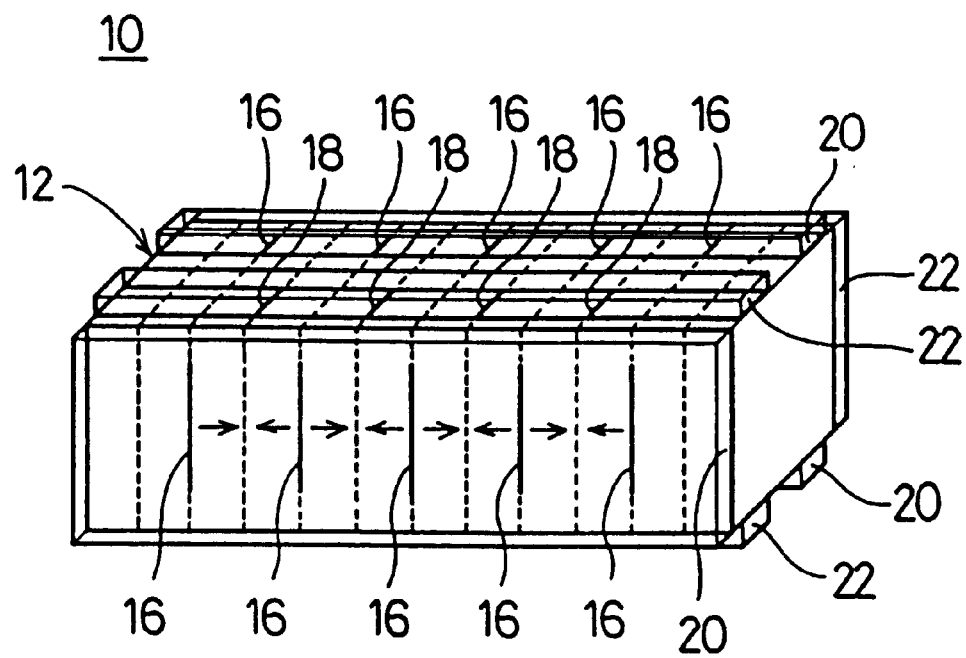
FIG. 19 is a view of yet another piezoelectric resonator according to a preferred embodiment of the present invention.

FIG. 19 is a view of yet another piezoelectric resonator according to preferred embodiments of the present invention. The piezoelectric resonator shown in FIG. 19 is different from the piezoelectric resonators described above especially in the inner electrodes 16 and 18 and the external electrodes 20 and 22.

Figure 20A:
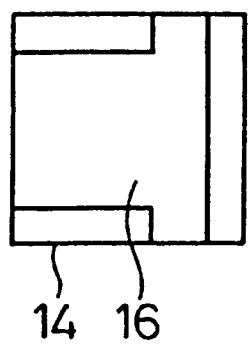
FIG. 20(a) and 20(b) are plan views of electrodes used in the piezoelectric resonator shown in FIG. 19.
Figure 20B:
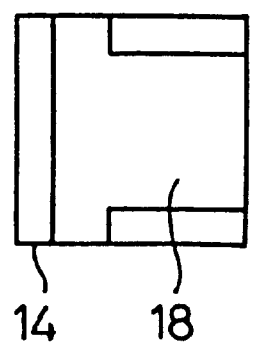
Figure 21A:
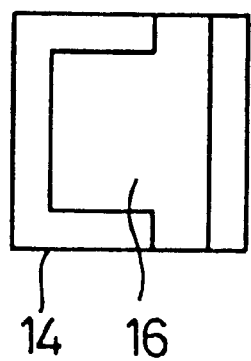
FIG. 21(a) and 21(b) are plan views of modifications of the inner electrodes used in the piezoelectric resonator shown in FIG. 19.
Figure 21B:
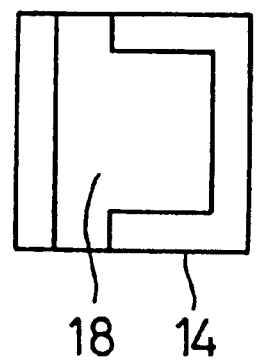

In the piezoelectric resonator 10 shown in FIG. 19, first group of inner electrodes 16 are disposed on main surfaces of piezoelectric layers 14 extending from the center to the middle of each of three sides, the upper side, the lower side, and one vertical side, as shown in FIG. 20(a), and second group of inner electrodes 18 have the reflected image of the first group of inner electrodes 16 and are located on main surfaces of the piezoelectric layers 14 extending from the center to the middle of each of three sides, the other vertical side, the upper side, and the lower side as shown in FIG. 20(b).

First external electrodes 20 are formed on one side surface, the upper side surface, and the lower side surface of the base member 12 so as to connect to the first group of inner electrodes 16. Second external electrodes 22 are located on the other side surface, the upper side surface, and the lower side surface of the base member 12 so as to connect to the second group inner electrodes 18. In this case, the external electrodes 20 and 22 are arranged in lines, respectively, on the upper side surface and the lower side surface of the base member 12.

The piezoelectric resonator 10 shown in FIG. 19 has another advantage. Since the external electrodes 20 and 22 are located on three different side surfaces of the base member 12, respectively, the resonator can be mounted, for example, to a circuit board with the current state, with a 90-degree-rotated state, and with an upside-down state.

Figure 22A:
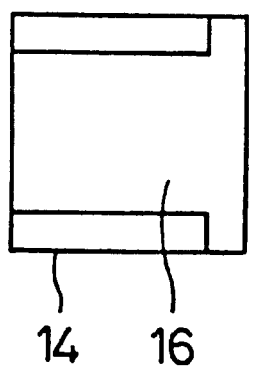
FIGS. 22(a), 22(b), 22(c), 22(d), 22(e), 22(f), 22(g), 22(h), 22(i), 22(j), 22(k), 22(l), 22(m) and 22(n) are plan views of other modifications of the electrodes used in the piezoelectric resonator shown in FIG. 19.
Figure 22B:
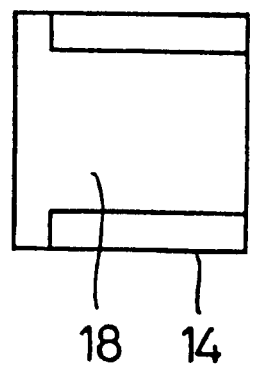
Figure 22C:
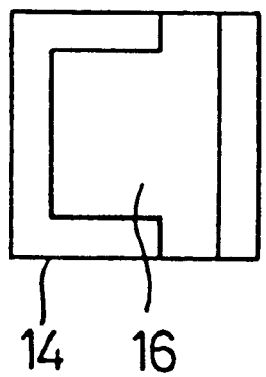
Figure 22D:
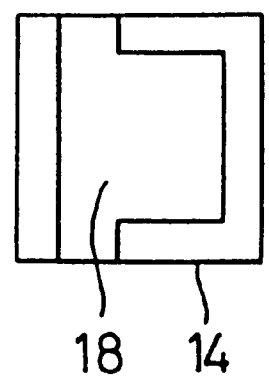

The piezoelectric resonator 10 shown in FIG. 19 may be configured such that the first group of inner electrodes 16 are not located at vertical portions at either side of piezoelectric layers 14 as shown in FIG. 22(c), as compared with the electrode shape shown in FIG. 20(a), and the second group of inner electrodes 18 have the reflected image of the first group of inner electrodes 16 and are not located at vertical portions at either side on main surfaces of piezoelectric layers 14 as shown in FIG. 22(d), as compared with the electrode shape shown in FIG. 20(b).

Figure 22E:
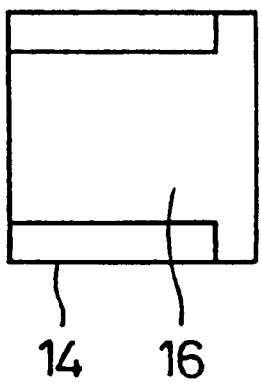
Figure 22F:
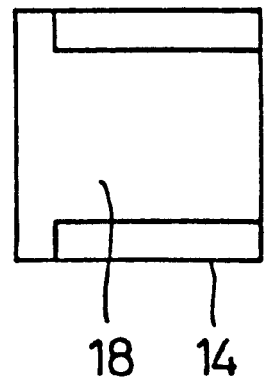
Figure 22G:
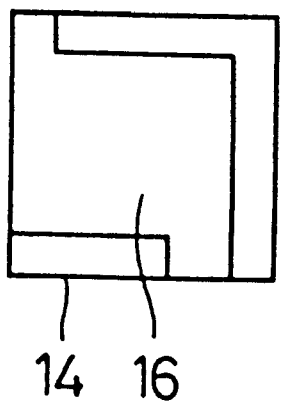
Figure 22H:
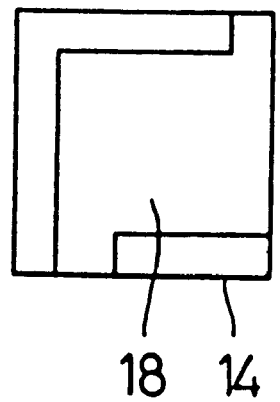
Figure 22I:
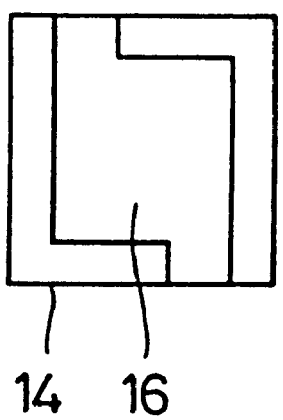
Figure 22J:
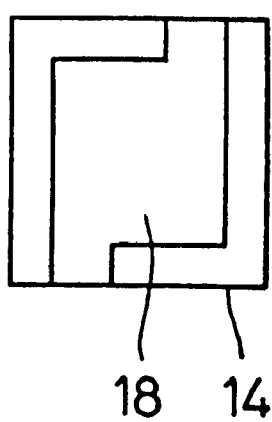
Figure 22K:
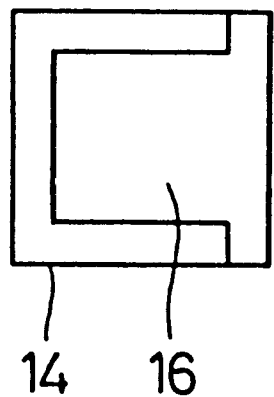
Figure 22L:
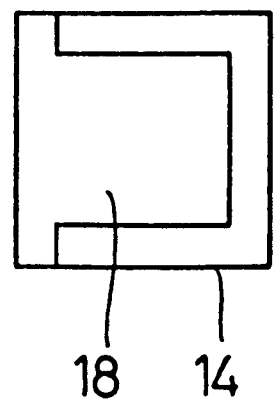
Figure 22M:
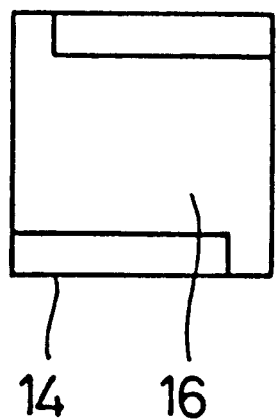
Figure 22N:
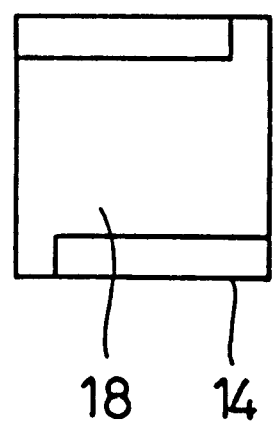

The piezoelectric resonator 10 shown in FIG. 19 may be configured such that the first group of inner electrodes 16 are located on main surfaces of piezoelectric layers 14 extending from the center to the vertical portions at both sides as shown in FIG. 22(e), and the second group of inner electrodes 18 have the reflected image of the first group of inner electrodes 16 and are located on main surfaces of piezoelectric layers 14 extending from the center to the vertical portions at both sides as shown in FIG. 22(f). In this case, the piezoelectric resonator 10 shown in FIG. 19 has another advantage. Even when the shape of the resonator is reduced in the width direction, since the ratio of the opposing area of the inner electrodes 16 and 18 to the area of a main surface of the piezoelectric layers 14 hardly changes, the size of the piezoelectric resonator can be reduced in the width direction without reducing the efficiency of the driving force generated in the piezoelectric layers 14.

In the piezoelectric resonator 10 shown in FIG. 19, the inner electrodes 16 and 18 may have the shapes shown in FIG. 22(g) and FIG. 22(h), FIG. 22(i) and FIG. 22(j), FIG. 22(k) and FIG. 22(l), or FIG. 22(m) and FIG. 22(n).

In the piezoelectric resonator 10 shown in FIG. 19, it is necessary to provide at least one first external electrode 20 connected only to the first group of inner electrodes 16 and at least one second external electrode 22 connected only to the second group of inner electrodes 18.

In each piezoelectric resonator 10 described above, the middle portion extending in the length direction of the base member 12 is piezoelectrically active and vibrates. Both ends in the longitudinal direction of the base member 12 are preferably piezoelectrically inactive sections. Only when the piezoelectric layers are polarized and an electric field is applied does the portion become piezoelectrically active, and otherwise the portion remains piezoelectrically inactive. If an inactive portion 24 has such characteristics, it may have another structure.

Figure 23:
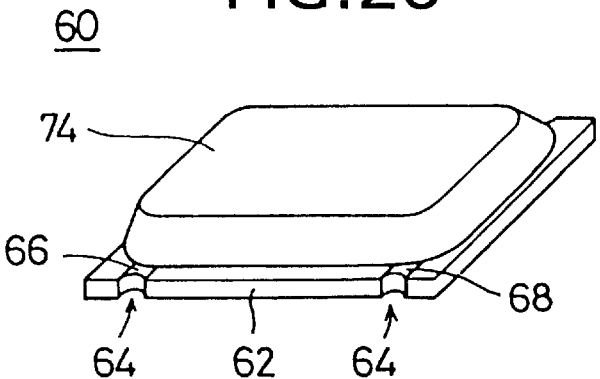
FIG. 23 is a perspective view of an electronic component using a piezoelectric resonator according a preferred embodiment of the present invention.
Figure 24:
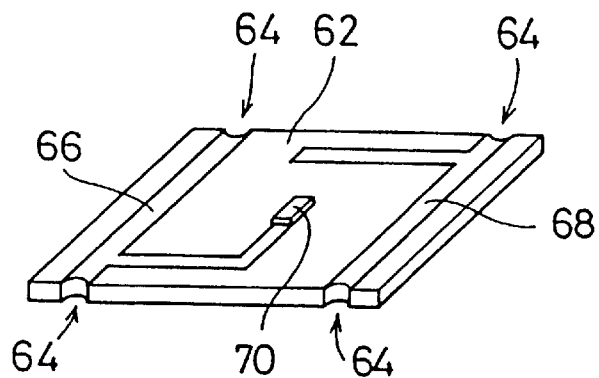
FIG. 24 is a perspective view of an insulating substrate used in the electronic component shown in FIG. 23.

Using such a piezoelectric resonator 10, electronic components such as oscillators and discriminators may be produced. FIG. 23 is a perspective view of an electronic component 60. The electronic component 60 includes an insulating substrate 62 functioning as a support member. At opposing end portions of the insulating substrate 62, two indentations 64 are preferably formed, respectively. On one surface of the insulating substrate 62, two pattern electrodes 66 and 68 are disposed as shown in FIG. 24. One pattern electrode 66 is disposed between opposing indentations 64 and extends in an L-shaped manner from a point near one end toward the center of the insulating substrate 62. The other pattern electrode 68 is located between opposing indentations 64 and extends straight from a point near the other end toward the center of the insulating substrate 62. The pattern electrodes 66 and 68 are arranged such that they are routed in a roundabout fashion from the indentations 64 of the insulating substrate 62 to the opposite surface.

Figure 25:
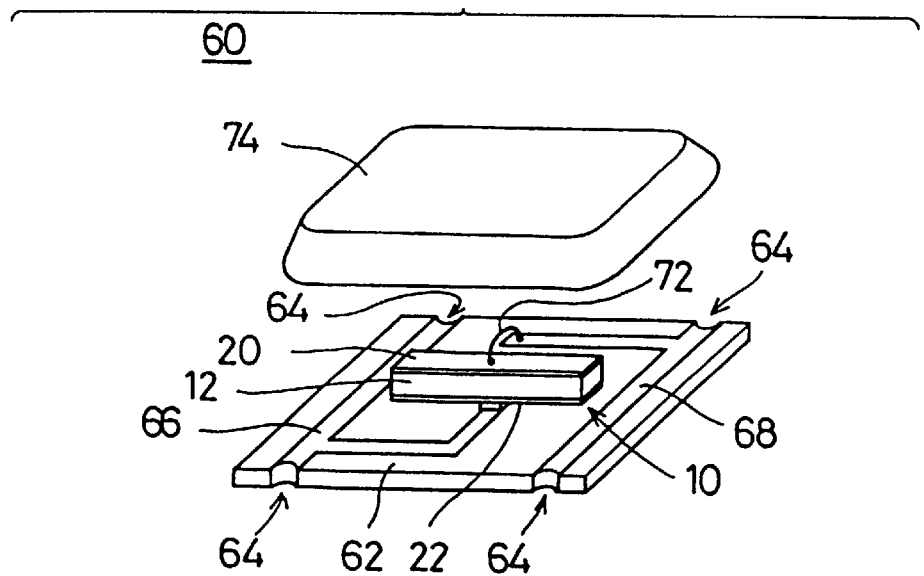
FIG. 25 is an exploded perspective view of the electronic component shown in FIG. 23.

At one end of the pattern electrode 66 disposed substantially at the center of the insulating substrate 62, a protrusion 70 which functions as a mounting member is formed of electrically conductive adhesive. As shown in FIG. 25, the above-described piezoelectric resonator 10 is mounted on the protrusion 70 such that the approximate center of the base member 12 is disposed on the protrusion 70. An external electrode 22 of the piezoelectric resonator 10 is, for example, connected to the protrusion 70. The protrusion 70 may be formed in advance on the piezoelectric resonator 10. The other external electrode 20 is connected to a pattern electrode 68 with electrically conductive wire 72. The electrically conductive wire 72 is connected to the center of the external electrode 20 of the piezoelectric resonator 10.

A metal cap 74 is placed on the insulating substrate 62. To prevent the metal cap 74 from being short-circuited to the pattern electrodes 66 and 68, insulating resin is applied to the insulating substrate 62 and the pattern electrodes 66 and 68 in advance. The metal cap 74 is placed thereon to complete the electronic component 60. The electronic component 60 uses the pattern electrodes 66 and 68, which are arranged to be routed to the rear surface from the indentations 64 of the insulating substrate 62, as input and output terminals for connecting to external circuits.

Since the protrusion 70 is provided and the approximate center of the piezoelectric resonator 10 is secured to the protrusion 70 in the electronic component 60, the ends of the piezoelectric resonator 10 are disposed separately from the insulating substrate 62 so vibration is not prevented or hindered. Excited longitudinal vibration is not weakened because the approximate center of the piezoelectric resonator, which serves as a vibration node, is secured to the protrusion 70 and is connected to the electrically conductive wire 72.

The electronic component 60 is preferably mounted on a circuit board together with IC chips and other electronic components to provide an oscillator or a discriminator. Since the electronic component 60 having this structure is sealed and protected by the metal cap 74, it can be used as a chip-type component, which can be mounted by reflow soldering.

When the electronic component 60 is used in an oscillator, spurious vibrations are suppressed to a low level and unusual vibration caused by the spurious vibrations are prevented due to the novel arrangement and features of the piezoelectric resonator 10 used in the electronic component 60. It is also easy to achieve impedance matching with an external circuit since the capacitance of the piezoelectric resonator 10 can be easily set to any desired value. Especially when the electronic component is used for an oscillator for voltage-controlled oscillation, a wide frequency range which cannot be obtained conventionally is easily achieved due to a large ΔF of the resonator.

When the electronic component 60 is used in a discriminator, a wide peak-separation range is achieved due to a large ΔF of the resonator. In addition, since the resonator provides a wide capacitance range, it is easy to achieve impedance matching with an external circuit.

Figure 26:
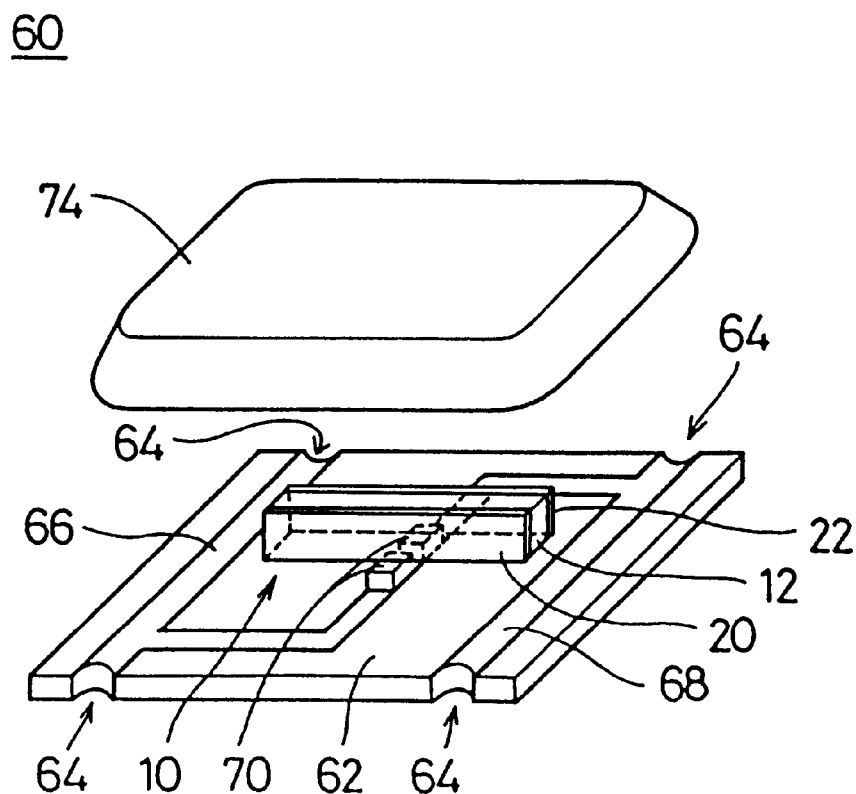
FIG. 26 is a view indicating another structure for mounting the piezoelectric resonator to the insulating substrate.
Figure 27:
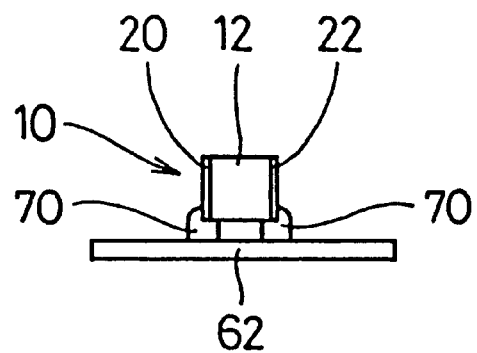
FIG. 27 is a side view showing the structure for mounting the piezoelectric resonator, shown in FIG. 26.
Figure 28:
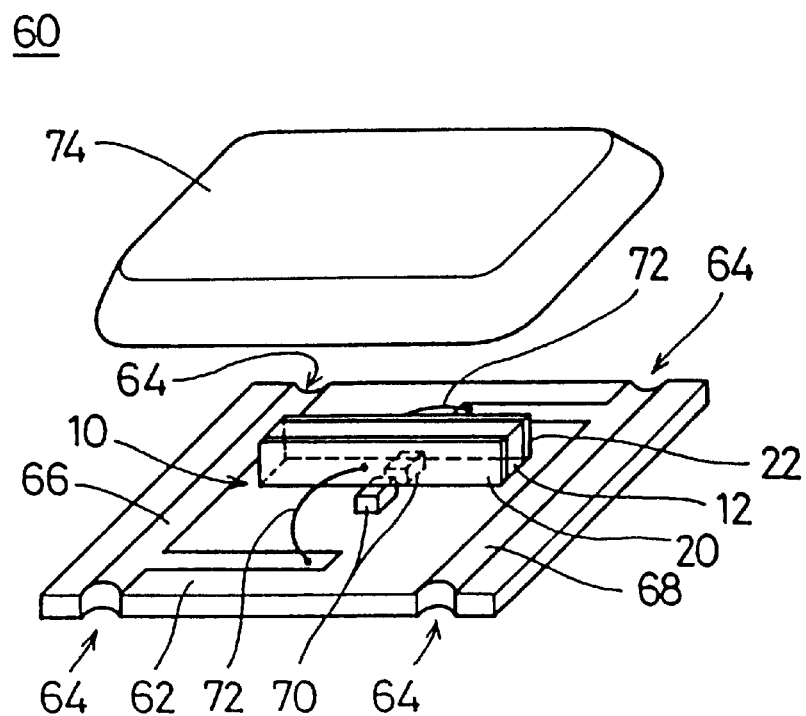
FIG. 28 is a view indicating still another structure for mounting the piezoelectric resonator to the insulating substrate.
Figure 29:
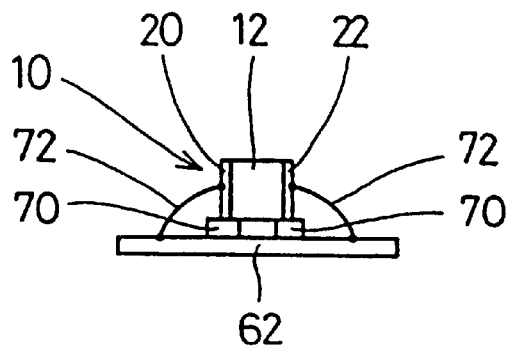
FIG. 29 is a side view showing the structure for mounting the piezoelectric resonator, shown in FIG. 28.

The piezoelectric resonator 10 may be mounted on the insulating substrate 62 so that two protrusions 70 made from an electrically conductive material such as electrically conductive adhesive are disposed on both pattern electrodes 66 and 68, and the external electrodes 20 and 22 of the piezoelectric resonator 10 are connected to the two protrusions 70, as shown in FIGS. 26 and 27. The piezoelectric resonator 10 may also be mounted on the insulating substrate 62 in a manner shown in FIGS. 28 and 29 in which two protrusions 70 made from an insulating material such as insulating adhesive are disposed on the insulating substrate 62 and the external electrodes 20 and 22 are connected to the pattern electrodes 66 and 68 via electrically conductive wire 72. The protrusions 70 may be disposed on the piezoelectric resonator 10 in advance.

Figure 30:
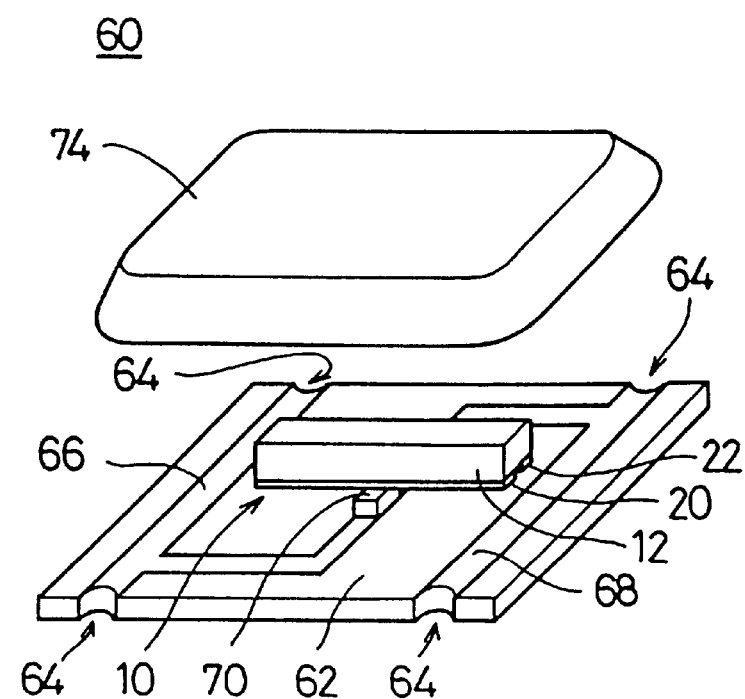
FIG. 30 is a view of another electronic component using a piezoelectric resonator according to a preferred embodiment of the present invention.
Figure 31:
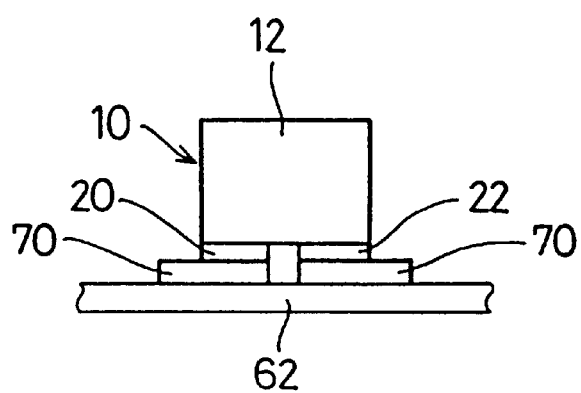
FIG. 31 is a side view showing the structure for mounting the piezoelectric resonator, shown in FIG. 30.

FIG. 30 is a view of another electronic component using a piezoelectric resonator according to preferred embodiments of the present invention. FIG. 31 is a side view showing how the piezoelectric resonator is mounted. The electronic component shown in FIG. 30 and FIG. 31 is different from that shown in FIG. 26 and FIG. 27 especially in that the piezoelectric resonator 10 in which the external electrodes 20 and 22 are disposed on one side surface of the base member 12, for example as shown in FIG. 9, is used.

Figure 32:
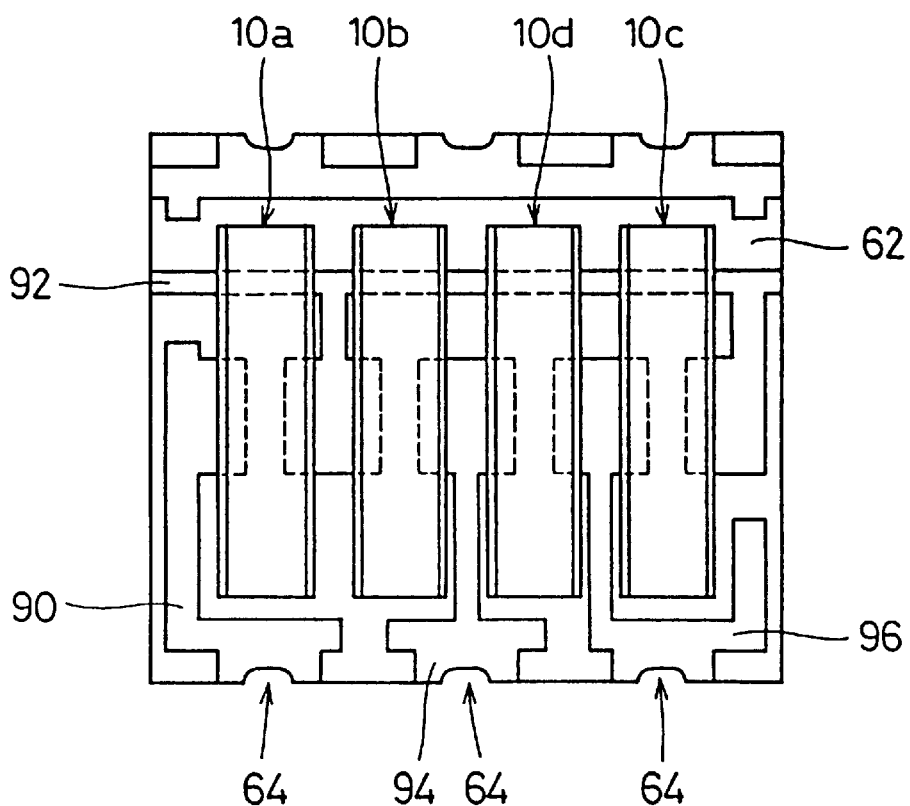
FIG. 32 is a plan view of the main portion of a ladder filter using piezoelectric resonators according to preferred embodiments of the present invention.
Figure 33:
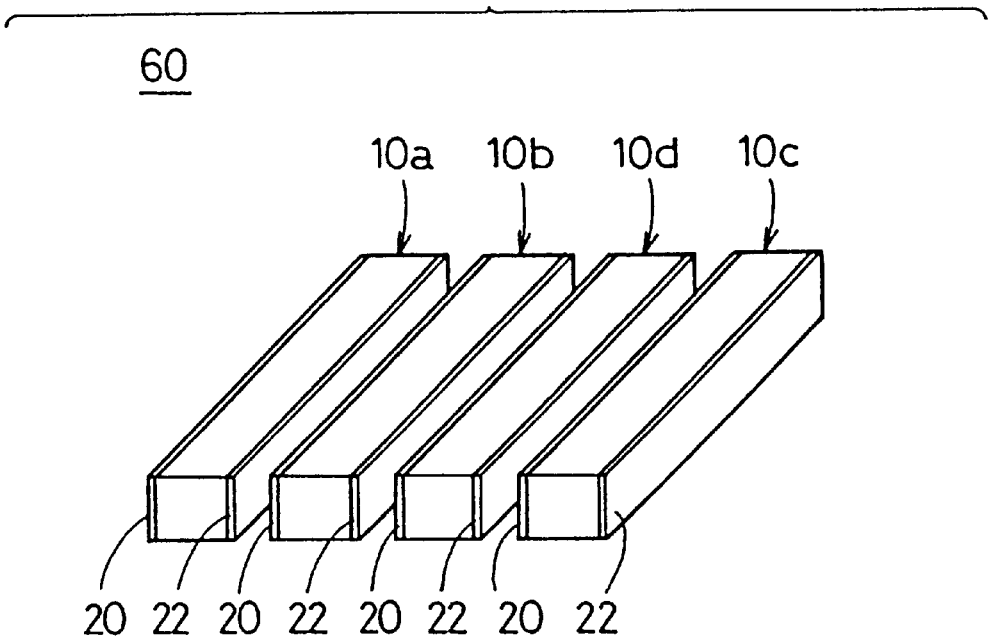
FIG. 33 is an exploded perspective view of the main portion of the ladder filter shown in FIG. 32.
Figure 33:
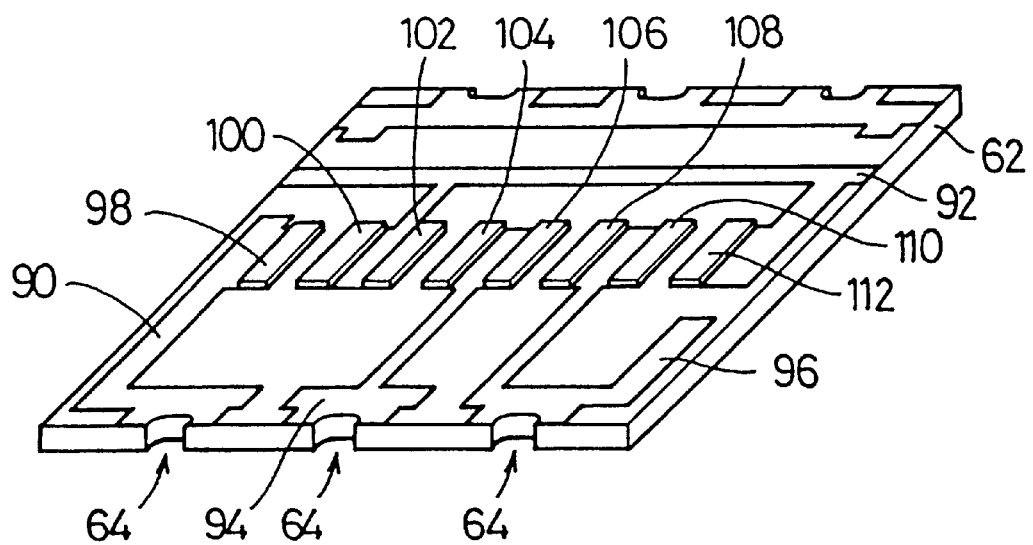

FIG. 32 is a plan of the main section of a ladder filter serving as an electronic component using a piezoelectric resonator according to preferred embodiments of the present invention. FIG. 33 is an exploded perspective view of the main section. In the electronic component 60 shown in FIGS. 32 and 33, four pattern electrodes 90, 92, 94, and 96 are disposed on an insulating substrate 62 serving as a support member. Five lands disposed in line at a certain interval are disposed on the pattern electrodes 90, 92, 94, and 96. The first land, which is closest to an end of the insulating substrate 62, is located on the pattern electrode 90, the second and fifth lands are located on the pattern electrode 92, the third land is located on the pattern electrode 94, and the fourth land is located on the pattern electrode 96. Mounting members are formed using electrically conductive adhesive on the five lands and arranged as follows: one protrusion 98 on the first land; two protrusions 100 and 102 on the second land; two protrusions 104 and 106 on the third land; two protrusions 108 and 110 on the fourth land, and one protrusion 112 on the fifth land. These protrusions 98, 100, 102, 104, 106, 108, 110, and 112 are preferably arranged in line at a certain interval.

The external electrodes 20 and 22 of piezoelectric resonators 10a, 10b, 10c, and 10d are mounted on the protrusions 98, 100, 102, 104, 106, 108, 110, and 112. The piezoelectric resonator 10 in which the external electrodes 20 and 22 are disposed on both side surfaces of the base member 12, for example as shown in FIG. 1 and FIG. 2, or FIG. 16, is used for these piezoelectric resonators 10a to 10d.

The protrusions 98, 100, 102, 104, 106, 108, 110, and 112 may be formed in advance on the piezoelectric resonators 10a, 10b, 10c, and 10d. The protrusions 98, 100, 102, 104, 106, 108, 110, and 112 may be bonded to the lands of the pattern electrodes 90, 92, 94, and 96 and the external electrodes 20 and 22 of the piezoelectric resonators 10a to 10d with the same type of electrically conductive adhesive as that constituting the protrusions 98, 100, 102, 104, 106, 108, 110, and 112 or another type of electrically conductive adhesive. This also applies to electronic components other than that shown in FIG. 32 and FIG. 33. Then, a metal cap (not shown) is placed on the insulating substrate 62.

Figure 34:
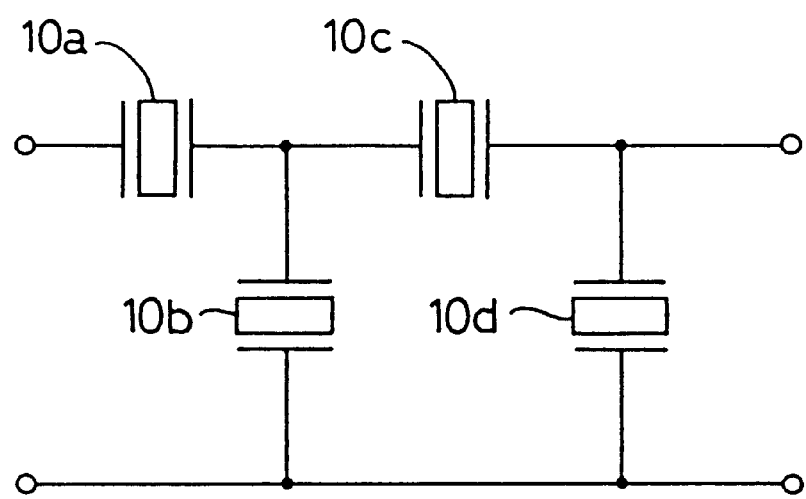
FIG. 34 is an equivalent circuit diagram of the ladder filter shown in FIGS. 32 and 33.

The electronic component 60 shown in FIG. 32 and FIG. 33 is used as a ladder filter having a ladder-shaped circuit shown in FIG. 34. Two piezoelectric resonators 10a and 10c serve as series resonators and the other two piezoelectric resonator 10b and 10d serve as parallel resonators. In such a ladder filter, the parallel piezoelectric resonators 10b and 10d are designed to have substantially larger capacitances than the series piezoelectric resonators 10a and 10c.

Attenuation in the ladder filter is determined by the capacitance ratio between the series resonators and the parallel resonators. In this electronic component 60 shown in FIG. 32 and FIG. 33, the capacitance can be adjusted by changing the number of laminated layers used in the piezoelectric resonators 10a to 10d. Therefore, a ladder filter having a larger attenuation with fewer resonators is implemented by changing the capacitances of the piezoelectric resonators, as compared with a case where the conventional unstiffened piezoelectric resonators are used. Since the piezoelectric resonators 10a to 10d have a larger ΔF than the conventional piezoelectric resonator, a wider transmission frequency band is achieved as compared with a case in which the conventional piezoelectric resonator is used.

In the electronic component 60 shown in FIGS. 32 and 33, since two electrodes of adjacent piezoelectric resonators are mounted on two protrusions disposed on the same land, the two electrodes of adjacent piezoelectric resonators do not need to be insulated and thus, adjacent resonators can be located very close to each other thereby, allowing the component to be made compact and have a substantially reduced size.

Figure 35:
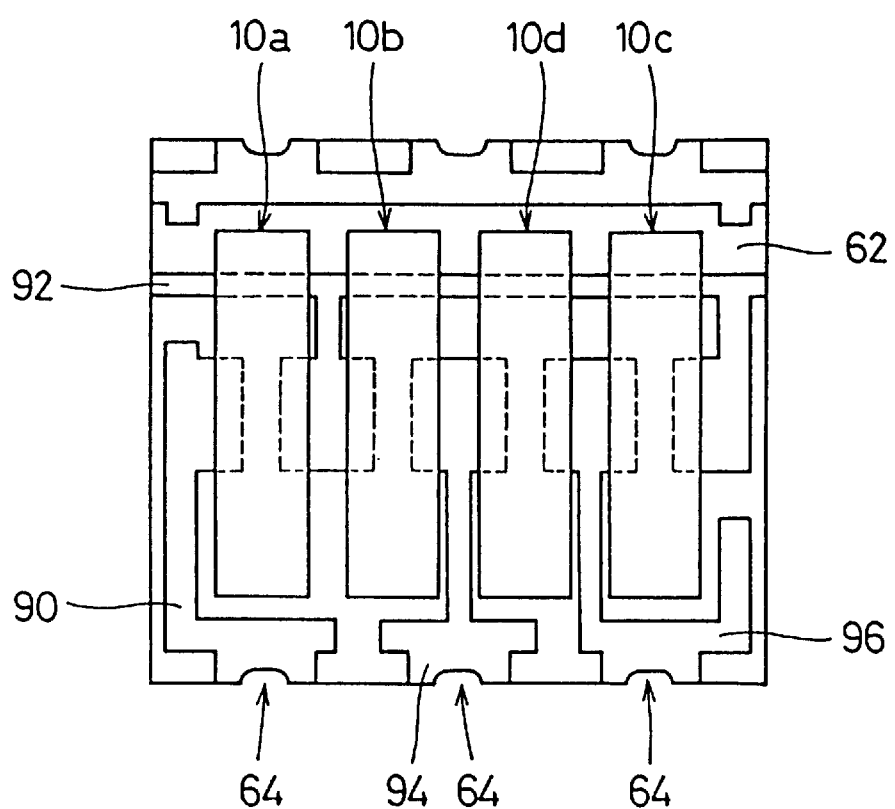
FIG. 35 is a plan view of the main portion of another ladder filter using piezoelectric resonators according to a preferred embodiment of the present invention.
Figure 36:
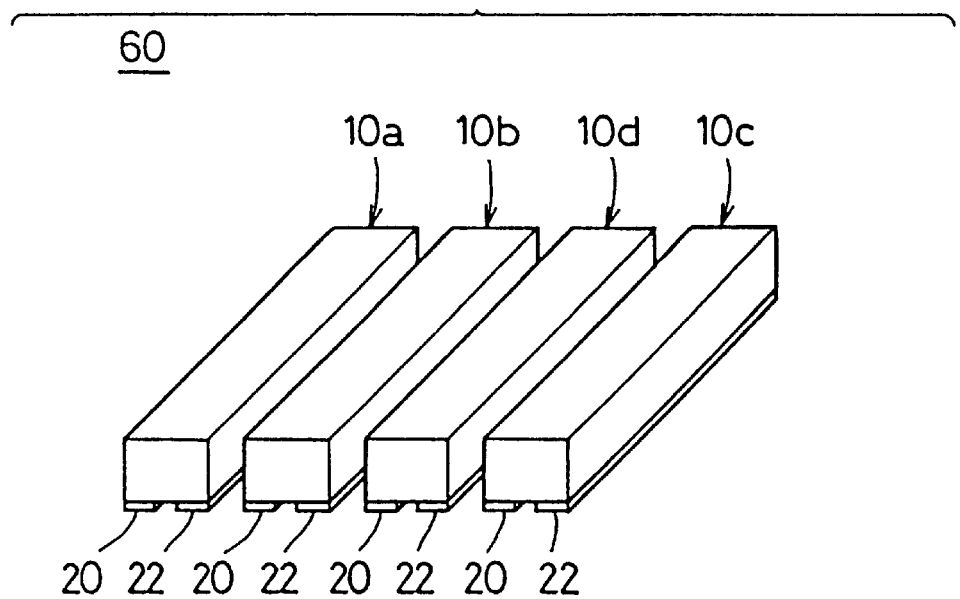
FIG. 36 is an exploded perspective view of the main portion of the ladder filter shown in FIG. 35.
Figure 36:
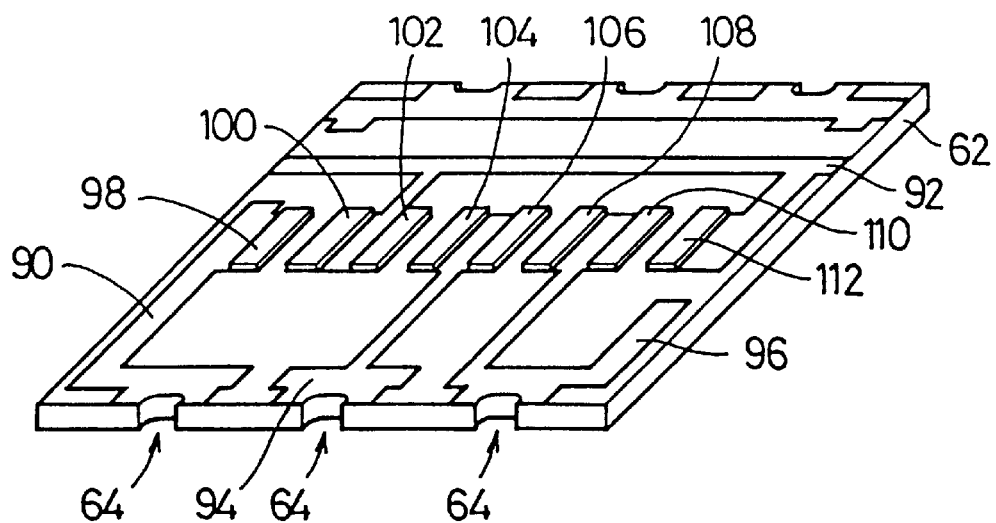
Figure 37:
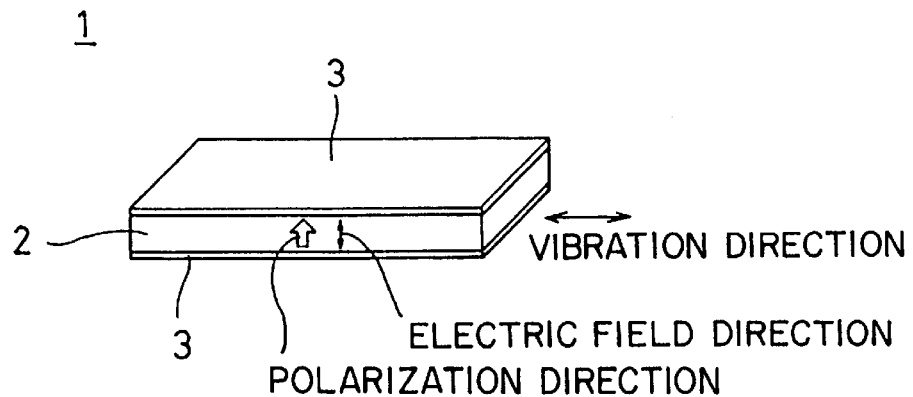
FIG. 37 is a perspective view of a conventional piezoelectric resonator.
Figure 38:
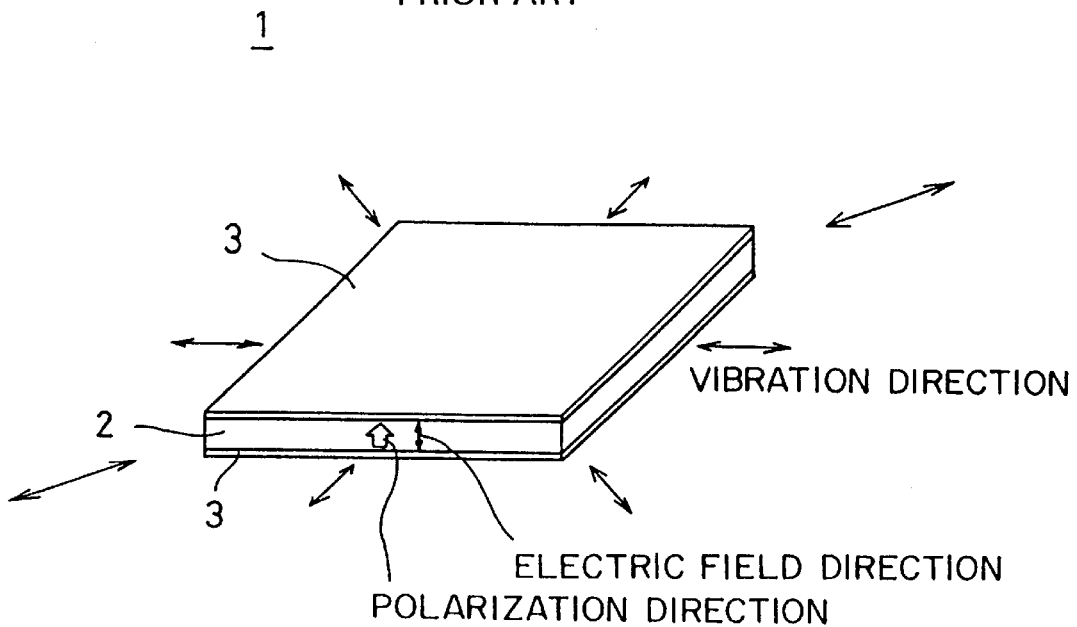
FIG. 38 is a perspective view of another conventional piezoelectric resonator.

FIG. 35 is a plan of the main section of another ladder filter serving as an electronic component using a piezoelectric resonator according to preferred embodiments of the present invention. FIG. 36 is an exploded perspective view of the main section. The electronic component shown in FIGS. 35 and 36 differs from the electronic component shown in FIG. 32 and FIG. 33 especially in that the piezoelectric resonator 10 in which the external electrodes 20 and 22 are formed on one side surface of the base member 12, for example as shown in FIG. 9 or FIG. 19, is used for piezoelectric resonators 10a, 10b, 10c, and 10d. The electronic component shown in FIG. 35 and FIG. 36 achieves the same advantage as the electronic component shown in FIG. 32 and FIG. 33.

Each electronic component described above preferably has a chip shape configuration. In other preferred embodiments of the present invention, an electronic component may have a shape other than a chip shape.

In each piezoelectric resonator 10 described above, the plurality of piezoelectric layers 14 are preferably alternately polarized in opposing directions. However, the polarization directions of the plurality of piezoelectric layers 14 are not limited to this arrangement.

In each piezoelectric resonator 10 described above, the dimensions of the piezoelectric layers 14 in the longitudinal direction of the base member 12 or the distances between adjacent inner electrodes 16 and 18 are preferably identical. In other preferred embodiments, the dimensions may not be identical and the distances may not be identical.

In each piezoelectric resonator 10 described above, one piezoelectric layer 14 is preferably disposed between adjacent inner electrodes 16 and 18. However, a plurality of piezoelectric layers may be located between the electrodes 16, 18.

In each piezoelectric resonator 10 described above, the electrodes 16 and 18 connected to the external electrodes 20 and 22 are alternately formed. The inner electrodes 16 and 18 may not be formed alternately in other preferred embodiments.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator comprising:
a base member having a longitudinal direction;
a plurality of inner electrodes disposed substantially perpendicularly to the longitudinal direction of said base member at intervals in the longitudinal direction of said base member;
a first external electrode and a second external electrode located on a surface of said base member and connected to said plurality of inner electrodes; wherein
said base member includes a plurality of laminated piezoelectric layers;
said plurality of piezoelectric layers are polarized in the longitudinal direction of said base member;
said plurality of inner electrodes are located on surfaces of said plurality of piezoelectric layers so as to be substantially perpendicular to the longitudinal direction of said base member;
a first group of said inner electrodes are connected to the first external electrode and are arranged so as not to be exposed at a portion of the base member where the second external electrode is located;
a second group of said inner electrodes are connected to the second external electrode and arranged so as not to be exposed at a portion of the base member where there first external electrode is located; and
said base member is arranged such that when an electric field is applied to said base member between said first and second external electrodes to generate basic longitudinal vibration in said base member, a vibration node at which point substantially no vibration occurs is defined at an approximate center of said base member.

2. The piezoelectric resonator according to claim 1, wherein one of a center axis and a center point of a shape formed by overlapping adjacent ones of said inner electrodes is substantially the same as one of a center axis and a center point of said base member in a plane that is substantially perpendicular to the longitudinal direction of said base member.

3. The piezoelectric resonator according to claim 1, wherein said first and second external electrodes are provided on different side surfaces of said base member, respectively.

4. The piezoelectric resonator according to claim 1, wherein said first and second external electrodes are provided on one common side surface of said base member.

5. The piezoelectric resonator according to claim 1, further comprising a support member, and a mounting member disposed between said support member and a center portion of said base member along the longitudinal direction thereof.

6. A piezoelectric resonator according to claim 1, wherein said piezoelectric resonator vibrates in a longitudinal vibration mode; and said first and second external electrodes extend along the longitudinal direction of said base member on one side surface of said base member.

7. The piezoelectric resonator according to claim 6, wherein a groove is formed along the longitudinal direction of said base member at a center in the width direction on the side surface of said base member where said first and second external electrodes are located, and said first and second external electrodes are disposed on first side and a second side separated by the groove on the side surface of said base member, respectively.

8. The piezoelectric resonator according to claim 7, wherein said first and second groups of said inner electrodes comprise a plurality of said inner electrodes, respectively.

9. The piezoelectric resonator according to claim 8, further comprising a mounting member disposed substantially at the center in the longitudinal direction of said base member.

10. An electronic component according to claim 9, further comprising a substrate having an electrode disposed thereon, wherein said base member is mounted on said substrate via said mounting member; and
 a cap is disposed on the substrate so as to cover said base member.

11. An electronic component according to claim 1, further comprising a plurality of said base members and a substrate upon which an electrode and said plurality of base members are disposed and arrange to define a ladder filter; and
 a cap is disposed on the substrate so as to cover said base members.

12. A piezoelectric resonator comprising:
 a base member having a longitudinal direction;
 a plurality of inner electrodes disposed substantially perpendicularly to the longitudinal direction of said base member at intervals in the longitudinal direction of said base member;
 a first external electrode and a second external electrode located on at least one surface of said base member and connected to said plurality of inner electrodes; wherein
 a first group of said inner electrodes are connected to the first external electrode and are arranged so as not to be exposed at a portion of the base member where the second external electrode is located;
 a second group of said inner electrodes are connected to the second external electrode and arranged so as not to be exposed at a portion of the base member where there first external electrode is located; and
 said base member is arranged such that when an electric field is applied to said base member between said first and second external electrodes to generate basic longitudinal vibration in said base member, a vibration node at which point substantially no vibration occurs is defined at an approximate center of said base member.

13. The piezoelectric resonator according to claim 12, wherein an external surface of said base member contains only said external electrodes thereon.

14. The piezoelectric resonator according to claim 12, wherein no resin material is provided on an external surface of said base member.

15. The piezoelectric resonator according to claim 12, wherein said first and second external electrodes are located on different side surfaces of said base member.

16. The piezoelectric resonator according to claim 12, wherein said first and second external electrodes are located on one common side surface of said base member.

17. The piezoelectric resonator according to claim 12, wherein said base member includes at least one piezoelectrically active portion and at least one piezoelectrically inactive portion.

18. The piezoelectric resonator according to claim 12, wherein a groove is formed along the longitudinal direction of the base member and said first and second external electrodes are located on one common side surface of said base member and said groove is located between said first and second external electrodes.

19. An electronic component comprising:
 a piezoelectric resonator including:
  a base member having a longitudinal direction;
  a plurality of inner electrodes disposed substantially perpendicularly to the longitudinal direction of said base member at intervals in the longitudinal direction of said base member;
  a first external electrode and a second external electrode located on a surface of said base member and connected to said plurality of inner electrodes;
 a support member and a mounting member disposed between said support member and a center portion of said base member along the longitudinal direction thereof; wherein
 said base member includes a plurality of laminated piezoelectric layers;
 said plurality of piezoelectric layers are polarized in the longitudinal direction of said base member;
 said plurality of inner electrodes are located on surfaces of said plurality of piezoelectric layers so as to be substantially perpendicular to the longitudinal direction of said base member;
 a first group of said inner electrodes are connected to the first external electrode and are arranged so as not to be exposed at a portion of the base member where the second external electrode is located; and
 a second group of said inner electrodes are connected to the second external electrode and arranged so as not to be exposed at a portion of the base member where there first external electrode is located;
 said base member is arranged such that when an electric field is applied to said base member between said first and second external electrodes to generate basic longitudinal vibration in said base member, a vibration node at which point substantially no vibration occurs is defined at an approximate center of said base member;
 said support member comprises an insulating substrate having a pattern electrode thereon;
 said base member is mounted on said insulating substrate via said mounting member; and
 a cap is disposed on said insulating substrate so as to cover said base member.

20. A ladder filter comprising:
 a plurality of piezoelectric resonators each including:
  a base member having a longitudinal direction;
  a plurality of inner electrodes disposed substantially perpendicularly to the longitudinal direction of said base member at intervals in the longitudinal direction of said base member;
  a first external electrode and a second external electrode located on a surface of said base member and connected to said plurality of inner electrodes;
 a support member and a mounting member disposed between said support member and a center portion of said base member along the longitudinal direction thereof; wherein
 said base member includes a plurality of laminated piezoelectric layers;
 said plurality of piezoelectric layers are polarized in the longitudinal direction of said base member;
 said plurality of inner electrodes are located on surfaces of said plurality of piezoelectric layers so as to be substantially perpendicular to the longitudinal direction of said base member;
 a first group of said inner electrodes are connected to the first external electrode and are arranged so as not to be exposed at a portion of the base member where the second external electrode is located; and
 a second group of said inner electrodes are connected to the second external electrode and arranged so as not to be exposed at a portion of the base member where there first external electrode is located;
 said base member is arranged such that when an electric field is applied to said base member between said first and second external electrodes to generate basic longitudinal vibration in said base member, a vibration node at which point substantially no vibration occurs is defined at an approximate center of said base member;

said support member comprises an insulating substrate having a pattern electrode thereon;

said base member is mounted on said insulating substrate via said mounting member; and a cap is disposed on said insulating substrate so as to cover said base member.

* * * * *